United States Patent
Kim et al.

(10) Patent No.: US 12,270,858 B2
(45) Date of Patent: Apr. 8, 2025

(54) SYSTEM AND METHOD FOR OPTIMIZATION OF CURRENT EXCITATION FOR IDENTIFICATION OF BATTERY ELECTROCHEMICAL PARAMETERS BASED ON ANALYTIC SENSITIVITY EXPRESSION

(71) Applicants: LG ENERGY SOLUTION, LTD., Seoul (KR); THE REGENTS OF THE UNIVERSITY OF CALIFORNIA, A CALIFORNIA CORPORATION, Oakland, CA (US)

(72) Inventors: Geum-Bee Kim, Daejeon (KR); Hyoung Jun Ahn, Daejeon (KR); Won-Tae Joe, Daejeon (KR); Qingzhi Lai, Davis, CA (US); Xinfan Lin, Davis, CA (US)

(73) Assignees: LG ENERGY SOLUTION, LTD., Seoul (KR); THE REGENTS OF THE UNIVERSITY OF CALIFORNIA, A CALIFORNIA CORPORATION, Oakland, CA (US)

( * ) Notice: Subject to any disclaimer, the term of this patent is extended or adjusted under 35 U.S.C. 154(b) by 61 days.

(21) Appl. No.: 18/018,803

(22) PCT Filed: Aug. 4, 2021

(86) PCT No.: PCT/KR2021/010306
§ 371 (c)(1),
(2) Date: Jan. 30, 2023

(87) PCT Pub. No.: WO2022/031059
PCT Pub. Date: Feb. 10, 2022

(65) Prior Publication Data
US 2023/0305066 A1    Sep. 28, 2023

(30) Foreign Application Priority Data

Aug. 4, 2020  (KR) ........................ 10-2020-0097631

(51) Int. Cl.
*G01R 31/367* (2019.01)
*G01R 31/3835* (2019.01)

(52) U.S. Cl.
CPC ....... *G01R 31/367* (2019.01); *G01R 31/3835* (2019.01)

(58) Field of Classification Search
None
See application file for complete search history.

(56) References Cited

U.S. PATENT DOCUMENTS

| 2010/0085057 A1 | 4/2010 | Nishi et al. |
| 2012/0098481 A1 | 4/2012 | Hunter et al. |

(Continued)

FOREIGN PATENT DOCUMENTS

| JP | 2004-103549 A | 4/2004 |
| JP | 2008-243373 A | 10/2008 |

(Continued)

OTHER PUBLICATIONS

Rothenberger et al., "Genetic optimization and experimental validation of a test cycle that maximizes parameter dentifiability of a Li-ion equivalent-circuit battery model," Journal of Energy Storage, 4: 156-166 (2015).

(Continued)

*Primary Examiner* — Jas A Sanghera
(74) *Attorney, Agent, or Firm* — Morgan, Lewis & Bockius LLP

(57) ABSTRACT

Disclosed is an analytic sensitivity expression for parameters of a battery electrochemical model, based on model reduction and reformulation techniques such as the single particle assumption, Padé approximation, and Laplace trans- (Continued)

form. The analytic expressions of sensitivity are in a compact form with explicit relationship to the current input, which enables the direct optimization of the input-dependent sensitivity. The current optimization with maximum sensitivity may be performed for several critical battery electrochemical parameters, namely a solid-phase lithium diffusion coefficient, a volume fraction of the electrode active material, and a reaction rate constant. The electrochemical parameter may be reliably identified using the optimal current profile.

21 Claims, 6 Drawing Sheets

(56) References Cited

U.S. PATENT DOCUMENTS

| | | |
|---|---|---|
| 2013/0302651 A1 | 11/2013 | Kim et al. |
| 2017/0256973 A1 | 9/2017 | Kim et al. |
| 2018/0198300 A1 | 7/2018 | Howey et al. |
| 2020/0132777 A1* | 4/2020 | K .................... G01R 31/389 |
| 2021/0013731 A1 | 1/2021 | Choe et al. |

FOREIGN PATENT DOCUMENTS

| | | |
|---|---|---|
| JP | 5036662 B2 | 9/2012 |
| JP | 2015-135286 A | 7/2015 |
| JP | 6222975 B2 | 11/2017 |
| KR | 10-2017-0103230 A | 9/2017 |
| KR | 10-2018-0082936 A | 7/2018 |
| KR | 10-1934288 B1 | 1/2019 |
| KR | 10-2020-0069203 A | 6/2020 |

OTHER PUBLICATIONS

Marcicki et al., "Design and parametrization analysis of a reduced-order electrochemical model of graphite/LiFePO4 cells for SOC/SOH estimation," Journal of Power Sources, 237: 310-324 (2013).
Forman et al., "Reduction of an Electrochemistry-Based Li-Ion Battery Model via Quasi-Linearization and Padé Approximation," Journal of The Electrochemical Society, 158(2): A93-A101 (2011).
Perez et al., "Optimal Charging of Batteries via a Single Particle Model with Electrolyte and Thermal Dynamics," American Control Conference, pp. 4000-4005 (2016).
Moura et al., "Battery State Estimation for a Single Particle Model with Electrolyte Dynamics," IEEE Transactions on Control Systems Technology, 25(2): 453-468 (2017).
International Search Report (with partial translation) and Written Opinion dated Nov. 22, 2021, for corresponding International Patent Application No. PCT/KR2021/010306.
Lai, et al., "Analytical derivation and analysis of parameter sensitivity for battery electrochemical dynamics", Journal of Power Sources, vol. 472 (2020), No. 228338, available online Jul. 20, 2020, pp. 1-15.
Lai, et al., "Optimization of Current Excitation for Identification of Battery Electrochemical Parameters based on Analytic Sensitivity Expression", 2020 American Control Conference, Denver, CO, Jul. 1-3, 2020, pp. 346-351.
Park, et al., "Optimal Input Design for Parameter Identification in an Electrochemical Li-ion Battery Model", 2018 Annual American Control Conference (ACC), Wisconsin Center, Milwaukee, WI, Jun. 27-29, 2018, pp. 2300-2305.
Extended European Search Report, dated Nov. 21, 2023, issued in corresponding EP Patent Application No. 21853017.8.

* cited by examiner

SYSTEM AND METHOD FOR OPTIMIZATION OF CURRENT EXCITATION FOR IDENTIFICATION OF BATTERY ELECTROCHEMICAL PARAMETERS BASED ON ANALYTIC SENSITIVITY EXPRESSION

TECHNICAL FIELD

The present disclosure relates to a system and method for optimization of current excitation for identification of battery electrochemical parameters.

The present application claims priority to Korean Patent Application No. 10-2020-0097631 filed on Aug. 4, 2020 in the Republic of Korea, the disclosures of which are incorporated herein by reference.

BACKGROUND ART

Parameter identification is a critical topic in battery modeling and control research. This is because parameter accuracy determines the fidelity of the model and hence the performance of model-based battery state estimation and control. Since many parameters for an electrochemical battery model cannot be directly measured, a common practice is to use certain algorithms to fit the model parameters to the measured input and output data, e.g., current, voltage, and temperature. In this case, the quality of data significantly affects the accuracy of parameter identification and estimation, which depends on the sensitivity of the data to the target parameters. Traditionally, people use undesigned or heuristic input current profiles and output voltage response for parameter estimation. For example, constant-current (CC) profile, constant-voltage (CV) profile, pulse current, sinusoidal current, drive cycle current, and the like are used. However, it is often the case that the resultant data are not sensitive to most of the target parameters, leading to poor parameter identification or estimation accuracy.

Recently, in order to improve the parameter estimation accuracy, the research on data analysis and optimization has been trending. Metrics including sensitivity, and sensitivity-based Fisher information matrix (FIM) and Cramer-Rao bound have been used to quantify the quality of data or the accuracy of the estimation results.

As an example, an optimal current profile for estimating the parameters of a battery equivalent circuit model may be designed by maximizing the determinant of the Fisher information matrix. This method is disclosed in the paper by M. J. Rothenberger, D. J. Docimo, M. Ghanaatpishe, and H. K. Fathy, "Genetic optimization and experimental validation of a test cycle that maximizes parameter identifiability for a li-ion equivalent-circuit battery model," Journal of Energy Storage, vol. 4, pp. 156-166, 2015. These works have demonstrated promising results in improving the quality of parameter estimation as the designed profiles yield better estimation accuracy than the undesigned benchmark.

However, there are major limitations with existing works on data/input optimization for battery parameter estimation. Specifically, the aforementioned works need to first impose certain heuristic patterns on the input profile, and then perform optimization on the pattern. For example, the double-sinusoidal current pattern is considered, and the coefficients of the sine current, such as the frequency, amplitude, and phase angle, are optimized. In another example, the CC-CV current pattern is considered, and the current and voltage limits are optimized. In still another example, miscellaneous current patterns, including pulses, sine waves, and drive cycles, are chosen from a pre-established library, and the current patterns are combined to formulate the optimal profile. It is noted that the profile obtained in this way is only optimal with respect to the specific pattern considered, but not necessarily the ultimate global optimum.

It is of great interest to find the ultimate optimal profile not subject to any pre-set pattern and to explore the features of the optimal data for estimating different parameters. The main challenge facing the direct optimization of input without imposing pattern is the complexity of computing the sensitivity and the sensitivity-based metrics such as Fisher information. The complexity of computing is more serious especially for the PDE-based first-principle electrochemical model. One common approach for sensitivity calculation is the perturbation method. The perturbation method perturbs the target parameters by a certain amount and simulates the model to quantify the variation in the output. A more precise approach is to solve the sensitivity differential equations (SDEs). The SDEs are obtained by taking the partial derivative of the original model equations to the target variables. For both approaches, the computational load is intractable for optimization. This is because most algorithms need to iterate over a large search space to find the optimum.

DISCLOSURE

Technical Problem

The present disclosure is directed to providing a system and method for determining an optimal current excitation to estimate various electrochemical parameters.

In addition, the present disclosure is also directed to providing a system and method for reliably identifying electrochemical parameters by using an optimal current profile showing sensitivity to the electrochemical parameters.

Technical Solution

In one aspect of the present disclosure, there is provided a system for optimization of current excitation for identification of battery electrochemical parameters, comprising: a current applying unit coupled to a battery; a voltage measuring unit configured to measure a voltage of the battery; and a control unit operably coupled to the current applying unit and the voltage measuring unit.

Preferably, the control unit may be configured to: (i) determine a sensitivity transfer function corresponding to a partial derivative of an electrochemical parameter for a transfer function from a battery current to a particle surface concentration of an electrode by using an electrochemical model of the battery; (ii) determine an overpotential slope corresponding to a partial derivative of the particle surface concentration for an overpotential of the electrode or a partial derivative of an electrochemical parameter for the overpotential of the electrode by using the particle surface concentration of the electrode and a Butler-Volmer equation defining a correlation between the electrochemical parameter and the overpotential of the electrode; (iii) determine an OCP (Open Circuit Potential) slope corresponding to the partial derivative of the particle surface concentration for an OCP function of the electrode; (iv) determine a sensitivity profile of the electrochemical parameter for a battery voltage of the electrochemical model in a time domain by using the sensitivity transfer function, the overpotential slope and the OCP slope; and (v) change a battery current in the time domain and determine an optimal current profile so that a square integral of the sensitivity profile changing according to the battery current in the time domain is maximized.

Preferably, the control unit may be configured to change the battery current in the time domain not to deviate from a preset current boundary condition.

In addition, the control unit may be configured to change the battery current in the time domain so that the battery voltage of the electrochemical model does not deviate from a preset voltage boundary condition.

Preferably, the control unit may be configured to determine the optimal current profile using a pseudo-spectral method so that the square integral of the sensitivity profile changing according to the battery current in the time domain is maximized.

According to an embodiment, the pseudo-spectral method is a Legendre-Gauss-Radau (LGR) pseudo-spectral method with adaptive multi-mesh-interval collocation.

In the present disclosure, the electrochemical model of the battery may adopt single particle assumption and express the battery voltage (V) by the following equation.

$$V = \phi_{s,p} - \phi_{s,n} = (U_p(c_{se,p}) - U_n(c_{se,n}) + (\phi_{e,p} - \phi_{e,n}) + (\eta_p - \eta_n) - IR_l,$$

($\Phi_{s,i}$: electrode potential, $\Phi_{e,i}$: electrolyte potential at electrode boundary, U: predefined OCP function (V), $c_{se,i}$: particle surface concentration of lithium ion (mol·m$^{-3}$), $\eta_i$: overpotential at electrode-electrolyte interface, $R_l$: lumped ohmic resistance of battery ($\Omega$·m$^2$), i=p denotes positive electrode, and i=n denotes negative electrode)

Preferably, the transfer function from the battery current to the particle surface concentration of the electrode may be expressed by the following equation.

$$c_{se,i}(s) = \left[ \frac{-7R_{s,i}^4 s^2 + 420 D_{s,i} R_{s,i}^2 s + 3465 D_{s,i}^2}{F\varepsilon_{s,i} A\delta_i s \left( R_{s,i}^4 s^2 + 189 D_{s,i} R_{s,i}^2 s + 3465 D_{s,i}^2 \right)} \right] \cdot I(s)$$

($c_{se,i}$: particle surface concentration of lithium inserted into electrode (mol·m$^{-3}$), I: battery current (A), $R_{s,i}$: radius of electrode particle (m), $D_{s,i}$: solid-phase diffusion coefficient of electrode particle (m$^2$s$^{-1}$), A: electrode area (m$^2$), $\delta_i$: thickness of electrode (m), $\varepsilon_{s,i}$: volume fraction of active material with activity at electrode (no unit), F: Faraday constant (C·mol$^{-1}$), i: index indicating the type of electrode, which is p and n for a positive electrode and a negative electrode, respectively, s: Laplace transform variable)

According to an embodiment, the electrochemical parameter may be a solid-phase diffusion coefficient $D_{s,i}$ of the electrode, and the control unit may be configured to determine a sensitivity profile $$\frac{\partial V(t)}{\partial \varepsilon_{s,i}}$$

for the solid-phase diffusion coefficient $D_{s,i}$ of the electrode to the battery voltage V in the time domain by using the following equation.

$$\frac{\partial V(t)}{\partial D_{s,i}} = \pm \left( \frac{\partial \eta_i}{\partial c_{se,i}} + \frac{\partial U_i}{\partial c_{se,i}} \right) \cdot \frac{\partial c_{se,i}}{\partial D_{s,i}}(t)$$

$$\left( \frac{\partial \eta_i}{\partial c_{se,i}} \right)$$

is an overpotential slope corresponding to the partial derivative of the particle surface concentration $c_{se,i}$ for the overpotential $\eta_i$ of the electrode, $$\frac{\partial U_i}{\partial c_{se,i}}$$

is an OCP slope corresponding to the partial derivative of the particle surface concentration $c_{se,i}$ for the OCP function $U_i$ of the electrode, and $$\frac{\partial c_{se,i}}{\partial D_{s,i}}$$

is a sensitivity transfer function corresponding to the partial derivative of the solid-phase diffusion coefficient $D_{s,i}$ of the electrode for the transfer function from the battery current to the particle surface concentration $c_{se,i}$ of the electrode) According to another embodiment, the electrochemical parameter may be an active material volume fraction $\varepsilon_{s,i}$ of the electrode, and the control unit may be configured to determine a sensitivity profile $$\frac{\partial V(t)}{\partial \varepsilon_{s,i}}$$

for the active material volume fraction $\varepsilon_{s,i}$ of the electrode to the battery voltage V in the time domain by using the following equation.

$$\frac{\partial V(t)}{\partial \varepsilon_{s,i}} = \pm \frac{\partial \eta_i}{\partial \varepsilon_{s,i}}(t) \pm \left( \frac{\partial U_i}{\partial c_{se,i}} + \frac{\partial \eta_i}{\partial c_{se,i}} \right) \cdot \frac{\partial c_{se,i}}{\partial \varepsilon_{s,i}}(t)$$

$$\left( \frac{\partial \eta_i}{\partial c_{se,i}} \right)$$

is an overpotential slope corresponding to the partial derivative of the particle surface concentration $c_{se,i}$ for the overpotential $\eta_i$ of the electrode, $$\frac{\partial \eta_i}{\partial \varepsilon_{s,i}}(t)$$

is an overpotential slope corresponding to the partial derivative of the active material volume fraction $\varepsilon_{s,i}$ for the overpotential $\eta_i$ of the electrode, $$\frac{\partial U_i}{\partial c_{se,i}}$$

is an OCP slope corresponding to the partial derivative of the particle surface concentration $c_{se,i}$ for the OCP function $U_i$ of the electrode, and $$\frac{\partial c_{se,i}}{\partial \varepsilon_{s,i}}(t)$$

is a sensitivity transfer function corresponding to the partial derivative of the active material volume fraction $\varepsilon_{s,i}$ of the electrode for the transfer function from the battery current to the particle surface concentration $c_{se,i}$ of the electrode)

In another aspect of the present disclosure, there is also provided a system for identification of battery electrochemical parameters using the above system for optimization of current excitation, and the control unit may be configured to: (i) generate a measured battery voltage profile by measuring a battery voltage while applying the optimal current profile to the battery during a time corresponding to the time domain; (ii) generate a predicted battery voltage profile by predicting a battery voltage from the battery current profile during the time corresponding to the time domain by using the electrochemical model; (iii) decrease a difference between the predicted battery voltage profile and the measured battery voltage profile to a preset reference value by adjusting the electrochemical parameter, when the difference between the predicted battery voltage profile and the measured battery voltage profile is greater than a threshold; and (iv) identify the adjusted electrochemical parameter as a current electrochemical parameter of the battery.

In another aspect of the present disclosure, there is also provided a system for optimization of current excitation for identification of battery electrochemical parameters, comprising: a current applying device coupled to a battery; a voltage measuring device configured to measure a voltage of the battery; and a control unit operably coupled to the current applying device and the voltage measuring device.

Preferably, the control unit may be configured to: (i) determine an overpotential slope corresponding to a partial derivative of a reaction rate constant of the electrode for an overpotential of the electrode by using a particle surface concentration of the electrode and a Butler-Volmer equation defining a correlation between the reaction rate constant of the electrode and the overpotential of the electrode; (ii) determine a sensitivity profile of the reaction rate constant for a battery voltage of an electrochemical model in a time domain by using the overpotential slope; and (iii) change a battery current in the time domain and determine an optimal current profile so that a square integral of the sensitivity profile changing according to the battery current in the time domain is maximized.

Preferably, the control unit may be configured to change the battery current in the time domain not to deviate from a preset current boundary condition. In addition, the control unit may be configured to change the battery current in the time domain so that the battery voltage of the electrochemical model does not deviate from a preset voltage boundary condition.

Preferably, the control unit may be configured to determine the optimal current profile using a pseudo-spectral method so that the square integral of the sensitivity profile changing according to the battery current in the time domain is maximized.

According to an embodiment, the pseudo-spectral method is a Legendre-Gauss-Radau (LGR) pseudo-spectral method with adaptive multi-mesh-interval collocation.

In the present disclosure, the control unit may be configured to determine a sensitivity profile for the reaction rate constant $k_i$ of the electrode to the battery voltage V in the time domain by using the following equation.

$$\frac{\partial V(t)}{\partial k_i} = \pm \frac{\partial \eta_i}{\partial k_i} = \frac{\mp RT}{\alpha F k_i} \cdot \frac{\text{sign}(I)}{\sqrt{1 + \left(\frac{6\varepsilon_{s,i} j_{0,i} A \delta_i}{IR_{s,i}}\right)^2}}$$

(I: battery current, R: universal gas constant (J·mol$^{-1}$·K$^{-1}$), T: battery temperature (K), F: Faraday constant (C·mol$^{-1}$), $\varepsilon_{s,i}$: volume fraction of active material with activity at electrode (no unit), $j_{0,i}$: exchange current density (A·m$^{-2}$), $\alpha$: charge transfer coefficient, A: effective electrode area (m$^2$), $R_{s,i}$: radius of electrode particle (m), $\delta_i$: thickness of electrode (m))

In still another aspect of the present disclosure, there is also provided a system for identification of battery electrochemical parameters using the above system for optimization of current excitation, and the control unit may be configured to: (i) generate a measured battery voltage profile by measuring a battery voltage while applying the battery current profile to the battery during a time corresponding to the time domain; (ii) generate a predicted battery voltage profile by predicting a battery voltage from the battery current profile during the time corresponding to the time domain by using the electrochemical model of the battery; (iii) decrease a difference between the predicted battery voltage profile and the measured battery voltage profile to a preset reference value by adjusting the reaction rate constant of the electrode, when the difference between the predicted battery voltage profile and the measured battery voltage profile is greater than a threshold; and (iv) identify the adjusted reaction rate constant of the electrode as a current reaction rate constant.

In still another aspect of the present disclosure, there is also provided a method for optimization of current excitation for identification of battery electrochemical parameters, comprising: (a) determining a sensitivity transfer function corresponding to a partial derivative of an electrochemical parameter for a transfer function from a battery current to a particle surface concentration of an electrode by using an electrochemical model of a battery to which single particle assumption is applied; (b) determining an overpotential slope corresponding to a partial derivative of the particle surface concentration for an overpotential of the electrode or a partial derivative of an electrochemical parameter for the overpotential of the electrode by using the particle surface concentration of the electrode and a Butler-Volmer equation defining a correlation between the electrochemical parameter and the overpotential of the electrode; (c) determining an OCP slope corresponding to the partial derivative of the particle surface concentration for an OCP function of the electrode; (d) determining a sensitivity profile of the electrochemical parameter for a battery voltage of the electrochemical model in a time domain by using the sensitivity transfer function, the overpotential slope and the OCP slope; and (e) changing a battery current in the time domain and determining an optimal current profile so that a square integral of the sensitivity profile changing according to the battery current in the time domain is maximized.

In still another aspect of the present disclosure, there is also provided a method for identification of battery electrochemical parameters, comprising: generating a measured battery voltage profile by measuring a battery voltage while applying the optimal current profile to the battery during a time corresponding to the time domain; generating a predicted battery voltage profile by predicting a battery voltage from the battery current profile during the time corresponding to the time domain by using the electrochemical model;

decreasing a difference between the predicted battery voltage profile and the measured battery voltage profile to a preset reference value by adjusting the electrochemical parameter, when the difference between the predicted battery voltage profile and the measured battery voltage profile is greater than a threshold; and identify the adjusted electrochemical parameter as a current electrochemical parameter.

In still another aspect of the present disclosure, there is also provided a method for optimization of current excitation for identification of battery electrochemical parameters, comprising: (a) determine an overpotential slope corresponding to a partial derivative of a reaction rate constant of an electrode for an overpotential of the electrode by using a particle surface concentration of the electrode and a Butler-Volmer equation defining a correlation between the reaction rate constant of the electrode and the overpotential of the electrode; (b) determine a sensitivity profile of the reaction rate constant for a battery voltage of an electrochemical model in a time domain by using the overpotential slope; and (c) changing a battery current in the time domain and determining an optimal current profile so that a square integral of the sensitivity profile changing according to the battery current in the time domain is maximized.

In still another aspect of the present disclosure, there is also provided a method for identification of battery electrochemical parameters, comprising: generating a measured battery voltage profile by measuring a battery voltage while applying the battery current profile to the battery during a time corresponding to the time domain; generating a predicted battery voltage profile by predicting a battery voltage from the battery current profile during the time corresponding to the time domain by using the electrochemical model; decreasing a difference between the predicted battery voltage profile and the measured battery voltage profile to a preset reference value by adjusting the reaction rate constant of the electrode, when the difference between the predicted battery voltage profile and the measured battery voltage profile is greater than a threshold; and identifying the adjusted reaction rate constant of the electrode as a current reaction rate constant.

Advantageous Effects

In the present disclosure, the optimization of current excitation for battery electrochemical parameter estimation is provided. A methodology to design the optimal current profile over a given time domain has been formulated based on the analytic sensitivity expressions. In an embodiment of the present disclosure, the results for three parameters, namely the solid phase diffusion coefficient Ds, the volume fraction of the electrode active material $\varepsilon_s$, and the reaction rate constant k are demonstrated. The optimal patterns for different parameters and the underlying mechanisms have been discovered by correlating to the analytic expressions of the parameter sensitivity. It is interesting to note that the optimal patterns for different parameters are fundamentally distinctive. The numerical results may depend on the specific battery chemistry and parameter set under consideration. However, the fundamental patterns and features considered in the present disclosure are believed to be generalizable. In future work, the obtained optimized current profile will be used to estimate respective parameters, with the goal of significantly improving the estimation accuracy.

BRIEF DESCRIPTION OF DRAWINGS

The accompanying drawings illustrate an embodiment of the present disclosure and together with the foregoing disclosure, serve to provide further understanding of the technical features of the present disclosure, and thus, the present disclosure is not construed as being limited to the drawing.

MODES OF PRACTICE

Figure 1:
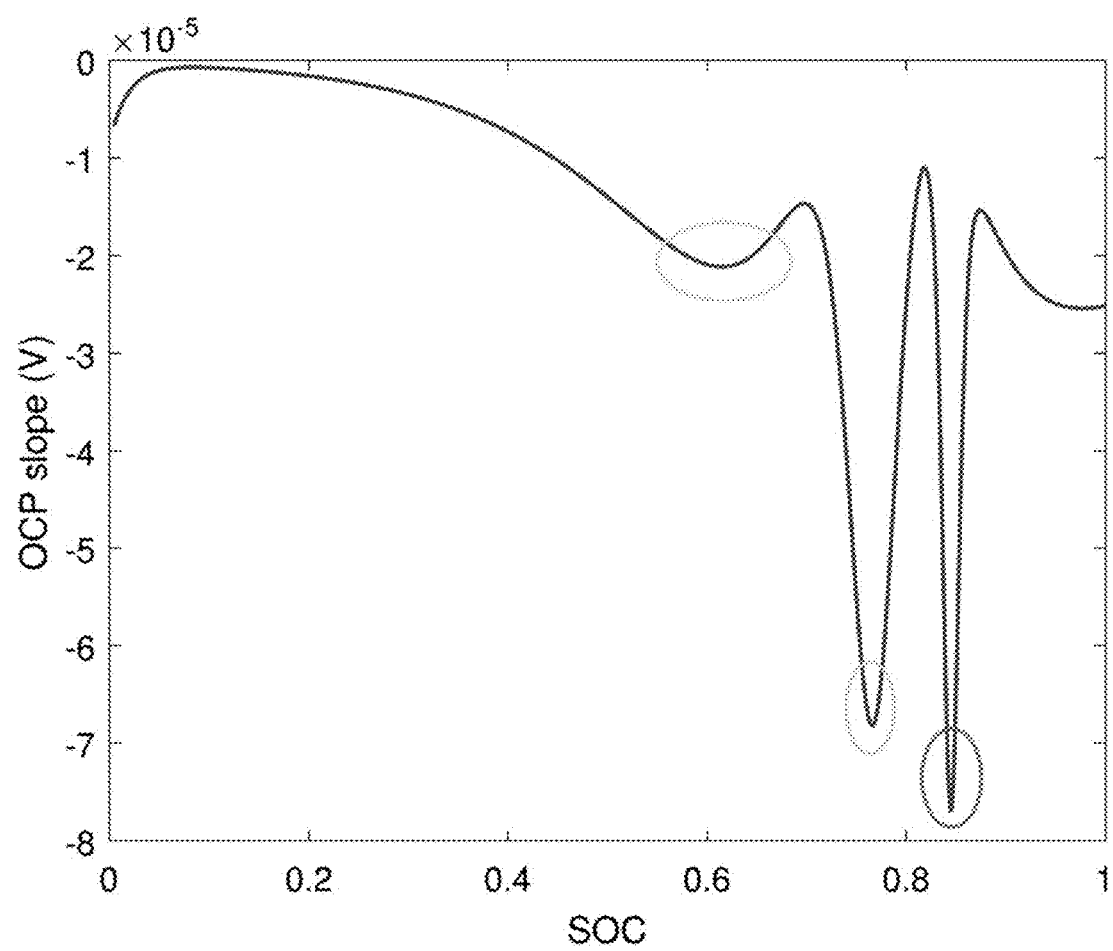
FIG. 1 is a graph showing an OCP (Open Circuit Potential) slope of a positive electrode over the entire SOC (State Of Charge) of a battery.

Hereinafter, embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

In the present disclosure, an analytic sensitivity expression for parameters of a battery electrochemical model will be derived based on model reduction and reformulation techniques such as the single particle assumption, Padé approximation, and Laplace transform.

The analytic expressions of parameter sensitivity obtained in the present disclosure are in a compact form with explicit relationship to the current input, which enables the direct optimization of the input-dependent sensitivity.

In the present disclosure, by using the derived analytic expressions, the current optimization for three critical battery electrochemical parameters, namely the solid-phase lithium diffusion coefficient, the volume fraction of the electrode active material, and the reaction rate constant, will be performed.

In the present disclosure, also, the patterns or features of the optimized current profile will be observed, and the fundamental mechanisms underlying these patterns will be explored by correlating to the analytic expressions of parameter sensitivity.

In the present disclosure, also, the Cramer-Rao bound analysis will be performed to quantify the anticipated estimation accuracy by using the designed profile.

First, the analytic sensitivity expressions of battery electrochemical parameters are first provided. As an embodiment, the analytic sensitivity equations for a solid phase diffusion coefficient $D_s$, a volume fraction $\varepsilon_s$ of an electrode active material, and a reaction rate constant k will be provided. These parameters reflect critical battery electrochemical properties related to key battery performance and are difficult to measure directly. Therefore, these parameters are chosen as target variables to be identified from data. Without loss of generality, the method of the present disclosure may be applied to other battery parameters of interest. Based on the analytic sensitivity expression, an optimization problem is then formulated, which aims at finding the optimal current profile for estimating the target parameters. In addition, the Cramer-Rao bound analysis is briefly reviewed, which will be used to quantify the expected estimation accuracy under the optimized current profiles.

First, various symbols used in an embodiment of the present disclosure are defined. If no definitions are given for symbols used in formulas of the present disclosure, the following definitions may be referred to.

$c_{se}$: particle surface concentration of solid-phase particle into which lithium is inserted [mol·m$^{-3}$]
$c_e$: lithium concentration in an electrolyte [mol·m$^{-3}$]
$\Phi_s$: potential of solid-phase particle [V]
$\Phi_e$: potential of an electrolyte [V]
$J_i^{Li}$: lithium-ion current density in an electrode [A·m$^{-2}$]
$i_0$: exchange current density [A·m$^{-2}$]
$\eta$: over-potential [V]
k: dynamic reaction rate [s$^{-1}$·mol$^{-0.5}$·m$^{2.5}$]
R: universal gas constant [J·mol$^{-1}$·K$^{-1}$]
F: Faraday constant [C·mol$^{-1}$]
T: temperature [K]
$\alpha_a$: charge transfer coefficient of a negative electrode [no units]
$\alpha_c$: charge transfer coefficient of a positive electrode [no units]
$c_{s,max}$: maximum concentration of lithium in solid-phase particle [mol·m$^{-3}$]
$\delta$: thickness of a predetermined area [m]
I: battery current [A], where a charging current is negative, and a discharging current is positive
V: terminal voltage of a battery [V]
A: effective electrode area [m$^2$]
Vol: electrode volume [m$^3$]
$D_s$: solid-phase diffusion coefficient [m$^2$·s$^{-1}$]
$D_e$: electrolyte diffusion coefficient [m$^2$·s$^{-1}$]
$a_s$: active surface area per electrode unit volume (m$^2$·m$^{-3}$, corresponding to $3*\varepsilon_s/R_s$)
$\varepsilon_s$: volume fraction of active material with activity in an electrode [no units]
$R_s$: radius of solid-phase active material particle [m]
U: open circuit potential of solid-phase active material [V]
$R_f$: solid-electrolyte interphase film resistance [$\Omega$·m$^2$]
$R_{lump}$: lumped resistance of a battery [$\Omega$·m$^2$]
$t_0^+$: Li ion transference [no units]
subscript eff: effective
subscript s: solid-phase
subscript e: electrolyte-phase
subscript p: positive electrode
subscript n: negative electrode

[Analytic Parameter Sensitivity Expressions]

The analytic expressions for the sensitivity of battery electrochemical parameters are derived based on the single particle assumption, electrochemical model reduction and reformulation techniques. A brief overview is provided here for reference.

First, in the single particle model (SPM), the battery voltage V may be expressed as in Equation (1-1) below.

$$V = \phi_{s,p} - \phi_{s,n} = (U_p(c_{se,p}) - U_n(c_{se,n})) + (\phi_{e,p} - \phi_{e,n}) + (\eta_p - \eta_n) - IR_l,$$  <Equation 1-1>

V: battery voltage (V), $\Phi_{s,i}$: electrode potential, $\Phi_{e,i}$: electrolyte potential at electrode boundary, U: open circuit potential (OCP) function (V), $c_{se,i}$: particle surface concentration of lithium (mol·m$^{-3}$), $\eta_i$: overpotential at electrode-electrolyte interface, $R_l$: lumped ohmic resistance of battery ($\Omega$·m$^2$), i=p denotes positive electrode, and i=n denotes negative electrode The evolution of the surface concentration $c_{se,i}$ is governed by the Fick's law of diffusion in the spherical coordinate. For the electrode particles, boundary conditions for diffusion of lithium may be expressed as Equation (1-2) below, and the boundary condition captures the change of lithium solid-phase concentration $c_{s,i}$ in time and space in the particle radius direction (r). The symbol i is a symbol indicating the type of electrode. If the symbol i is p, it indicates a positive electrode, and if the symbol i is n, it indicates a negative electrode.

$$\frac{\partial c_{s,i}}{\partial t} = D_{s,i}\left(\frac{\partial^2 c_{s,i}}{\partial r^2} + \frac{2}{r}\frac{\partial c_{s,i}}{\partial r}\right) \quad <\text{Equation 1-2}>$$

$$\left.\frac{\partial c_{s,i}}{\partial r}\right|_{r=0} = 0$$

$$\left.D_{s,i}\frac{\partial c_{s,i}}{\partial r}\right|_{r=R_{s,i}} = \frac{j_i^{Li} R_{s,i}}{3\varepsilon_{s,i} F}$$

$D_{s,i}$: solid-phase diffusion coefficient of lithium (m$^2$·s$^{-1}$), $c_{s,i}$: solid-phase concentration of lithium (mol·m$^{-3}$), $R_{s,i}$: electrode particle radius (m), $\varepsilon_{s,i}$: volume fraction of active material with activity at electrode (no unit), F: Faraday constant (C/mol), r: variables in spherical coordinate system In the single particle model (SPM), the current density $J_i^{Li}$ of Equation (1-2) is assumed to be constant across the electrode, so it can be calculated by dividing the total current I by the electrode volume as in Equation (1-3) below.

$$j_i^{Li} = \frac{I}{A\delta_i} \quad <\text{Equation 1-3}>$$

$J_i^{Li}$: lithium-ion current density at the electrode (A·m$^{-2}$), A: electrode area (m$^2$), $\delta_i$: electrode thickness (m)

Preferably, the partial differential equation (PDE) represented by Equation (1-2) can be discretized before solving it. In an embodiment of the present disclosure, Laplace transform and Padé approximation are used for discretization of Equation (1-2).

Padé approximation is an approximation theory that approximates a function using a rational function of a given degree. That is, Padé approximation approximates a predetermined function into a rational function with an n$^{th}$-order polynomial as the denominator and an m$^{th}$-order polynomial as the numerator.

Specifically, for discretization of Equation (1-2), Laplace transform of Equation (1-2) provides Equation (1-4) below.

$$D_{s,i}\frac{\partial^2 C_{s,i}(s)}{\partial r^2} + \frac{2D_{s,i}}{r}\frac{\partial C_{s,i}(s)}{\partial r} - sC_{s,i}(s) = 0 \qquad \langle \text{Equation 1-4}\rangle$$

Then, by matching the boundary condition of Equation (1-2), a transcendental transfer function from the input current I to the lithium concentration $c_{se,i}$ on the particle surface can be obtained as in Equation (1-5) below.

$$\frac{C_{se,i}}{I}(s) = -\frac{\left(e^{2R_{s,i}\sqrt{s/D_{s,i}}}-1\right)\frac{R_{s,i}^2}{3A\delta_i F\varepsilon_{s,i}D_{s,i}}}{1+R_{s,i}\sqrt{\frac{s}{D_{s,i}}}+e^{2R_{s,i}\sqrt{s/D_{s,i}}}\left(R_{s,i}\sqrt{\frac{s}{D_{s,i}}}-1\right)} \qquad \langle \text{Equation 1-5}\rangle$$

$C_{se,i}$: particle surface concentration of lithium inserted into electrode (mol·m$^{-3}$), I: battery current (A), $R_{s,i}$: radius of electrode particle (m), $D_{s,i}$: solid-phase diffusion coefficient of electrode particle (m$^2$·s$^{-1}$), A: electrode area (m$^2$), $\delta_i$: thickness of electrode (m), F: Faraday constant (C/mol), $\varepsilon_{s,i}$: volume fraction of active material with activity at electrode (no unit), s: Laplace transform variable, e: natural constant The transcendental transfer function represented by Equation (1-5) cannot be solved directly in the time domain. Therefore, a low-order rational transfer function is used for approximation based on moment matching.

As a result, the three-dimensional Padé approximation equation for lithium concentration $c_{se,i}$ on the particle surface can be obtained as in Equation (2) below, and the Padé approximation can be transformed into the time domain using the state space expression.

That is, in an embodiment of the present disclosure, by solving the governing equations using the single particle assumption, Laplace transform, and Padé approximation, the transfer function from current I to $c_{se,i}$ can be obtained as in Equation (2) below.

$$c_{se,i}(s) = \left[\frac{-7R_{s,i}^4 s^2 + 420D_{s,i}R_{s,i}^2 s + 3465D_{s,i}^2}{F\varepsilon_{s,i}A\delta_i s\left(R_{s,i}^4 s^2 + 189D_{s,i}R_{s,i}^2 s + 3465D_{s,i}^2\right)}\right]\cdot I(s) \qquad \langle \text{Equation 2}\rangle$$

$c_{se,i}$: particle surface concentration of lithium inserted into electrode (mol·m$^{-3}$), I: battery current (A), $R_{s,i}$: radius of electrode particle (m), $D_{s,i}$: solid-phase diffusion coefficient of electrode particle (m$^2$s$^{-1}$), A: electrode area (m$^2$), $\delta_i$: thickness of electrode (m), $\varepsilon_{s,i}$: volume fraction of active material with activity at electrode (no unit), F: Faraday constant (C·mol$^{-1}$), i=p denotes positive electrode, and i=n denotes negative electrode The Padé approximation for lithium concentration $c_{se,i}$ on the particle surface are disclosed in the paper by J. Marckcki, M. Cannova, A. T. Conlisk, and G. Rizzoni, "Design and parametrization analysis of a reduced-order electrochemical model of graphite/LiFePO$_4$ cells for SOC/SOH estimation", Journal of Power Sources, vol. 237, pp. 310-324, 2013, and the paper by J. C. Forman, S. Bashash, J. L. Stein, and H. K. Fathy, "Reduction of an Electrochemistry-Based Li-Ion Battery Model vis Quasi-Liniearization and Pade Approximation", Journal of The Electrochemical Society, vol. 158, no. 2, p. A93, 2011. The contents of these papers may be incorporated as a part of this specification.

According to Equation (2), the target parameters, i.e. active material volume fraction $\varepsilon_{s,i}$ and solid-phase diffusion coefficient $D_{s,i}$, govern the dynamics of the particle surface concentration $c_{se,i}$. Also, the particle surface concentration $c_{se,i}$ affects the battery voltage V through the open circuit potential U according to Equation (1-1).

The overpotential $\eta_i$, which governs the intercalation/deintercalation of lithium ions into/from the electrode particle, can be computed through Equation (3) and Equation (4) derived by inverting the Butler-Volmer Equation.

$$\eta_i = \frac{RT}{\alpha F}\ln\left(\xi_i + \sqrt{\xi_i^2 + 1}\right) \qquad \langle \text{Equation 3}\rangle$$

$$\xi_i = \frac{j_i^{Li}R_{s,i}}{6\varepsilon_{s,i}j_{0,i}} \qquad \langle \text{Equation 4}\rangle$$

$J_i^{Li}$: current density according to movement of lithium ion (A·m$^{-2}$), $j_{0,i}$: exchange current density (A·m$^{-2}$), R: universal gas constant (J·mol$^{-1}$·K$^{-1}$), T: battery temperature (K), $\alpha$: charge transfer coefficient (no unit), F: Faraday constant (C·mol$^{-1}$), $\varepsilon_{s,i}$: volume fraction of active material with activity at electrode (no unit)

In Equation (4), $j_{0,I}$ is exchange current density (A·m$^{-2}$), which is calculated using Equation (5) below.

$$j_{0,i}=Fk_i(c_e)^\alpha(c_{s,i}^{max}-c_{se,i})^\alpha(c_{se,i})^\alpha \qquad \langle \text{Equation 5}\rangle$$

$c_{s,i}^{max}$: maximum solid-phase lithium concentration (mol·m$^{-3}$), $c_{se,i}$: particle surface concentration (mol·m$^{-3}$), $\alpha$: charge transfer coefficient (no unit)

Under the single particle assumption, the current density $j_i^{Li}$ may be approximated as the average current over the electrode as in Equation (6) below.

$$j_i^{LA} = \frac{I}{A\delta_i} \qquad \langle \text{Equation 6}\rangle$$

A: electrode area (m$^2$), I: battery current (A), $\delta_i$: thickness of electrode (m)

According to Equations (3) to (5), the reaction rate constant $k_i$ and the active material volume fraction $\varepsilon_i$ affect the overpotential $\eta_i$ through $j_{0,i}$ and $\xi_i$ respectively, and hence affect the battery voltage. In addition, since the overpotential $\eta_i$ is dependent on the exchange current density $j_{0,i}$, which is related to the surface concentration $c_{se,i}$ as in Equation (5), the solid-phase diffusion coefficient $D_{s,i}$ and the active material volume fraction $\varepsilon_i$ have an indirect impact on overpotential through the particle surface concentration $c_{se,i}$ as well.

Based on the above relationship between parameters and terminal voltage, the analytic expression representing the sensitivity of each parameter can be derived by taking the respective partial derivative to the voltage.

In an example, the sensitivity to the solid-phase diffusion coefficient $D_{s,I}$ can be expressed as in Equation (7) below.

$$\frac{\partial V}{\partial D_{s,i}} = \pm\left(\frac{\partial \eta_i}{\partial c_{se,i}} + \frac{\partial U_i}{\partial c_{se,i}}\right)\cdot\frac{\partial c_{se,i}}{\partial D_{s,i}}(t) \qquad \langle \text{Equation 7}\rangle$$

V: battery voltage (V), $\eta_i$: overpotential of electrode (V), $c_{se,i}$: particle surface concentration (mol·m$^{-3}$), $U_i$: OCP of electrode (V), $D_{s,i}$: solid-phase diffusion coefficient of electrode (m$^2$·s$^{-1}$), t: time(s)

Here, $$\frac{\partial U_i}{\partial c_{se,i}}$$

is the slope of OCP.
In Equation (7), $$\frac{\partial \eta_i}{\partial c_{se,i}}$$

can be derived from Equation (3) by taking the partial derivative to $c_{se,i}$, and can be expressed as Equation (8) below.

$$\frac{\partial \eta_i}{\partial c_{se,i}} = \quad \langle \text{Equation 8} \rangle$$

$$\frac{RT}{2\alpha F} \cdot \frac{1}{\sqrt{1+\xi^{-2}}} [c_e c_{se,i}(c_{s,max,i} - c_{se,i})]^{-1} \cdot (c_e c_{s,max,i} - 2c_e c_{se,i})$$

$$\xi = \frac{j_i^{Li} R_{s,i}}{6\varepsilon_{s,i} j_{0,i}}$$

α: charge transfer coefficient, $c_e$: electrolyte-phase concentration of lithium (mol·m⁻³), $c_{se,i}$: particle surface concentration of lithium (mol·m⁻³), $c_{s,max,i}$: maximum solid-phase ion concentration (mol·m⁻³), $\varepsilon_{s,i}$: volume fraction of active material with activity at electrode (no unit), R: universal gas constant (J·mol⁻¹·K⁻¹), F: Faraday constant (C·mol⁻¹), $R_{s,i}$: radius of electrode particle (m), $J_i^{Li}$: current density according to movement of lithium ion (A·m⁻²), $j_{0,i}$: exchange current density (A·m⁻²)

It is noted that $$\frac{\partial U_i}{\partial c_{se,i}}$$

is typically dominant over $$\frac{\partial \eta_i}{\partial c_{se,i}} \frac{\partial c_{se,i}}{\partial D_{s,i}}$$

is characterized by a sensitivity transfer function (STF), which is derived from Equation (2) by taking the partial derivative to the solid-phase diffusion coefficient $D_{s,i}$. The sensitivity transfer function (STF) of the solid-phase diffusion coefficient $D_{s,I}$ can be expressed as Equation (9) below.

$$\frac{\partial C_{se,i}(s)}{\partial D_{s,i}} = \quad \langle \text{Equation 9} \rangle$$

$$\frac{(43 R_{s,i}^4 s^2 + 1980 D_{s,i} R_{s,i}^2 s + 38115 D_{s,i}^2)}{(R_{s,i}^4 s^2 + 189 D_{s,i} R_{s,i}^2 s + 3465 D_{s,i}^2)^2} \cdot \frac{21 R_{s,i}^2}{F\varepsilon_{s,i} A \delta_i} I(s).$$

According to an embodiment, the sensitivity transfer function of the solid-phase diffusion coefficient $D_{s,i}$ can be easily implemented in time domain through a state space model in a canonical format as in Equation (10), for sensitivity computation or optimization.

In Equation (10), the initial conditions of the states x1, x2, x3 and x4 can be set as 0, but the present disclosure is not limited thereto.

<Equation 10>

$$\begin{bmatrix} x_1' \\ x_2' \\ x_3' \\ x_4' \end{bmatrix} = \begin{bmatrix} 0 & 1 & 0 & 0 \\ 0 & 0 & 1 & 0 \\ 0 & 0 & 0 & 1 \\ \frac{(-12006225 D_{s,i}^4)}{(R_{s,i}^8)} & \frac{-1309770 D_{s,i}^3}{R_{s,i}^6} & \frac{-42651 D_{s,i}^2}{R_{s,i}^4} & \frac{-387 D_{s,i}}{R_{s,i}^2} \end{bmatrix} \begin{bmatrix} x_1 \\ x_2 \\ x_3 \\ x_4 \end{bmatrix} + \begin{bmatrix} 0 \\ 0 \\ 0 \\ 1 \end{bmatrix} I$$

$$y = \frac{\partial c_{se,i}(t)}{\partial D_{s,i}} = \frac{21}{F\varepsilon_{s,i} A \delta_i R_{s,i}^6} [38115 D_{s,i}^2 \quad 1980 D_{s,i} R_{s,i}^2 \quad 43 R_{s,i}^4 \quad 0] \begin{bmatrix} x_1 \\ x_2 \\ x_3 \\ x_4 \end{bmatrix}$$

Also, $$\frac{\partial U_i}{\partial c_{se,i}}$$

can be calculated using a predefined OCP function $U_i (c_{se,i})$ of the electrode. The particle surface concentration $c_{se,i}$ corresponding to the input of the OCP function $U_i$ can be calculated using Equation (2), which corresponds to the Pade approximation equation for $c_{se,i}$. That is, the particle surface concentration $c_{se,i}$ can be easily calculated in the time domain by converting Equation (2) into a state space model in canonical format such as Equation (11) below. In Equation (11), the initial conditions of the states x1, x2 and x3 can be set using the initial SOC of the battery.

$$\begin{bmatrix} x_1' \\ x_2' \\ x_3' \end{bmatrix} = \begin{bmatrix} 0 & 1 & 0 \\ 0 & 0 & 1 \\ 0 & \frac{-3465 D_{s,i}^2}{R_{s,i}^4} & \frac{-189 D_{s,i}}{R_{s,i}^2} \end{bmatrix} \begin{bmatrix} x_1 \\ x_2 \\ x_3 \end{bmatrix} + \begin{bmatrix} 0 \\ 0 \\ -1 \end{bmatrix} I \quad \langle \text{Equation 11} \rangle$$

$$y = c_{se,i}(t) = \frac{1}{F\varepsilon_{s,i} A \delta_i R_{s,i}^4} [3465 D_{s,i}^2 \quad 420 D_{s,i} R_{s,i}^2 \quad 7 R_{s,i}^4] \begin{bmatrix} x_1 \\ x_2 \\ x_3 \end{bmatrix}$$

Similar to the above description, the analytic sensitivity expression for the active material volume fraction $\varepsilon_{s,i}$ can be derived.

First, the analytic sensitivity $$\frac{\partial V(t)}{\partial \varepsilon_{s,i}}$$

for the active material volume fraction $\varepsilon_{s,i}$ can be obtained by taking the partial derivative of the active material volume fraction $\varepsilon_{s,i}$ to Equation (1-1) as shown in Equation (12) below.

$$\frac{\partial V(t)}{\partial \varepsilon_{s,i}} = \mp \frac{\partial \eta_i}{\partial \varepsilon_{s,i}}(t) \pm \left(\frac{\partial U_i}{\partial c_{se,i}} + \frac{\partial \eta_i}{\partial \varepsilon_{s,i}}\right) \cdot \frac{\partial c_{se,i}}{\partial \varepsilon_{s,i}}(t) \quad \text{<Equation 12>}$$

V: battery voltage (V), $\eta_i$: overpotential of electrode (V), $U_i$: OCP of electrode (V), $c_{se,i}$: particle surface concentration (mol·m$^{-3}$), $\varepsilon_{s,i}$: volume fraction of active material with activity at electrode (no unit)

In Equation (12), $$\frac{\partial \eta_i}{\partial \varepsilon_{s,i}}$$

can be obtained by taking the partial derivative of the active material volume fraction $\varepsilon_{s,i}$ to Equation (3) as shown in Equation (13) below.

$$\frac{\partial \eta_i}{\partial \varepsilon_{s,i}} = \frac{RT}{\alpha F \varepsilon_{s,i}} \cdot \frac{\text{sign}(I)}{\sqrt{1+\left(\frac{6\varepsilon_{s,i} j_{0,i} A \delta_i}{IR_{s,i}}\right)^2}} \quad \text{<Equation 13>}$$

In Equation (12), $$\frac{\partial c_{se,i}}{\partial \varepsilon_{s,i}}$$

can be obtained by taking the partial derivative of the active material volume fraction $\varepsilon_{s,i}$ to Equation (2) as shown in Equation (14) below.

$$\frac{\partial C_{se,i}(s)}{\partial \varepsilon_{s,i}} = \frac{7R_{s,i}^4 s^2 + 420 D_{s,i} R_{s,i}^2 s + 3465 D_{s,i}^2}{s\left(R_{s,i}^4 s^2 + 189 D_{s,i} R_{s,i}^2 s + 3465 D_{s,i}^2\right)} \cdot \frac{I(s)}{F\varepsilon_{s,i}^2 A \delta_i} \quad \text{<Equation 14>}$$

According to an embodiment, the sensitivity transfer function of the active material volume fraction $\varepsilon_{s,i}$ can be easily calculated in the time domain through a state space model in a canonical format as in Equation (15), for sensitivity computation or optimization. In Equation (15), the initial conditions of the states x1, x2, x3 and x4 can be set as 0, but the present disclosure is not limited thereto.

$$\begin{bmatrix} \dot{x}_1 \\ \dot{x}_2 \\ \dot{x}_3 \end{bmatrix} = \begin{bmatrix} 0 & 1 & 0 \\ 0 & 0 & 1 \\ 0 & \frac{-3465 D_{s,i}^2}{R_{s,i}^4} & \frac{-189 D_{s,i}}{R_{s,i}^2} \end{bmatrix} \begin{bmatrix} x_1 \\ x_2 \\ x_3 \end{bmatrix} + \begin{bmatrix} 0 \\ 0 \\ 1 \end{bmatrix} I \quad \text{<Equation 15>}$$

$$y = \frac{\partial c_{se,i}(t)}{\partial \varepsilon_{s,i}} = \frac{1}{F \varepsilon_{s,i}^2 A \delta_i R_{s,i}^4} \begin{bmatrix} 3465 D_{s,i}^2 & 420 D_{s,i} R_{s,i}^2 & 7 R_{s,i}^4 \end{bmatrix} \begin{bmatrix} x_1 \\ x_2 \\ x_3 \end{bmatrix}$$

In Equation (12), the method of calculating $$\frac{\partial U_i}{\partial c_{se,i}}$$

is substantially the same as described above.

Finally, the analytic sensitivity expression of the reaction rate constant $k_i$ can be obtained by taking the partial derivative of the reaction rate constant $k_i$ to Equation (1-1) as in Equation (16) below.

In the electrochemical model to which the single particle model (SPM) is applied, the analytic sensitivity expression for the reaction rate constant $k_i$ corresponds to the partial derivative of the reaction rate constant $k_i$ with respect to the overpotential $\eta_i$ of the electrode, that is, the overpotential slope $$\frac{\partial \eta_i}{\partial k_i}$$

$$\frac{\partial V(t)}{\partial k_i} = \pm \frac{\partial \eta_i}{\partial k_i} = \frac{\mp RT}{\alpha F K_i} \cdot \frac{\text{sign}(I)}{\sqrt{1+\left(\frac{6\varepsilon_{s,i} j_{0,i} A \delta_i}{IR_{s,i}}\right)^2}} \quad \text{<Equation 16>}$$

The analytic sensitivity expressions obtained above are all low order functions where the battery current is an input variable.

The analytic expressions according to the embodiment of the present disclosure enable the direct optimization of current profile to maximize sensitivity. In addition, the analytic sensitivity expression also provides theoretic insights to explain the fundamental mechanisms intrinsic in the electrochemical model.

The derived expressions have been validated against the exact sensitivity obtained from numerical simulation of the full order electrochemical model.

[Set-Up of Optimization Problem]

The goal of optimization is to obtain the optimal current profile for identification of the electrochemical parameter. The optimal current profile maximizes the sensitivity or sensitivity-related metrics (e.g. Fisher information) of certain parameters subject to operation constraints. The optimization problem of the current profile can be expressed as Equation (17) below under the voltage constraint c1 and the current constraint c2.

$$\min_{I(t)} - \int_0^{t_f} S_\theta^2(t) dt \quad \text{<Equation 17>}$$

c1: $V_{min} \leq V(t) \leq V_{max}$ c2: $I_{min} \leq I(t) \leq I_{max}$

In the optimization problem of Equation (17), the objective function is the integral of the square (namely, the square integral) of $S_\theta(t)$, which represents the normalized sensitivity of a certain parameter $\theta$, over the specified time interval from $t_0$ to $t_f$. The solution of the optimization problem is a current profile in the time domain ($t_0$ to $t_f$) that may maximize the magnitude of the object function. The objective function is equivalent to the Fisher information of single-parameter estimation under the assumption of independent and identically distributed Gaussian measurement noises. The normalized sensitivity $S_\theta(t)$ quantifies the ratio of variation in output and parameter, and is the sensitivity of a parameter multiplied by its nominal value as in Equation (18) below.

$$\overline{S}_\theta = \frac{\partial V}{\partial \theta} \cdot \theta \qquad <\text{Equation 18}>$$

In the battery model, the nominal values of different parameters differ significantly. Hence, the normalized sensitivity is a better representation of the impact of the parameter. The sensitivity can be computed in time domain by using the previously introduced analytic expressions. The inequality constraints c1 and c2 are adopted to maintain the battery within the reasonable operating range. The constraint on input current considers both the validity of single particle assumption under which the analytic sensitivity is derived and battery health. In addition, the constraint on voltage accommodates the recommended voltage window of the battery chemistry.

Since the optimization problem is highly nonlinear and non-convex, local optimum condition is a main challenge facing optimization. The pseudo-spectral method is an effective tool for solving complex nonlinear optimization problems and has been extensively applied to real-world engineering problems. The pseudo-spectral method is a numerical analysis method used in applied mathematics and engineering calculations to calculate solutions of partial differential equations. The pseudo-spectral method is also known as discrete variable representation.

In the embodiment of the present disclosure, the Legendre-Gauss-Radau (LGR) pseudo-spectral method with adaptive multi-mesh-interval collocation is adopted. The LGR pseudo-spectral method is realized by the General Purpose Optimal Control Software (GPOPS).

The GPOPS is one of the commercially available general-purpose MATLAB software that can obtain numerical solutions of optimization problems. The GPOPS software may implement the new class of variable-order Gaussian quadrature methods.

The variable-order Gaussian quadrature method approximates the continuous-time optimization problem as a sparse nonlinear programming problem (NLP) to facilitate the solution. The NLP is then solved using solvers, such as the Interior Point OPTimizer (IPOPT) and the Sparse Nonlinear OPTimizer (SNOPT).

[Cramer-Rao Bound]

After obtaining the optimal current profile using the LGR pseudo-spectral method, the expected estimation accuracy that can be achieved using the corresponding profile based on the Cramer-Rao Bound analysis can be evaluated. Given an output data profile y(t) measured over time from 0 to $t_f$, the Fisher information of a certain model parameter $\theta$ can be expressed as Equation (19) below under the assumption of independent and identically distributed Gaussian measurement noises. In Equation (19), $\sigma_y^2$ is the variance of the noise.

$$F = \frac{1}{\sigma_y^2} \int_0^{t_f} \left(\frac{\partial y(t)}{\partial \theta}\right)^2 dt \qquad <\text{Equation 19}>$$

The Fisher information expressed as Equation (19) is equivalent to the objective function expressed in Equation (17). By inverting the Fisher information matrix, the Cramer-Rao bound as in Equation (20) can be obtained.

$$\text{cov}(\hat{\theta}) \geq F^{-1} \qquad <\text{Equation 20}>$$

Equation (20) indicates the lower bound of the covariance of estimation error of an unbiased estimator. The Cramer-Rao bound is often used as an algorithm-independent metric to evaluate the quality of data.

[Optimization Results and Discussion]

In order to demonstrate the optimization method according to the present disclosure, the optimized current profiles will be disclosed over a 1800s time domain for the solid-phase diffusion coefficient $D_{s,p}$, the active material volume fraction $\varepsilon_{s,p}$, and the reaction rate coefficient $k_p$, respectively. The results are followed by analysis of the features of the optimized profiles. The battery used in the embodiment is a lithium cobalt oxide battery. The parameters are adopted from the values disclosed in the paper by S. Moura, "Single particle model with electrolyte and temperature: An electrochemical battery model." https://github.com/scott-moura/SPMeT. Accessed: 2019 Aug. 20. The OCP slope $$\frac{\partial U_p}{\partial c_{se}}$$

of the whole state of charge (SOC) range of the battery is shown in FIG. 1.

The OCP slope $$\frac{\partial U_p}{\partial c_{se}}$$

plays an important role in determining the sensitivity and optimal current patterns of the target parameters. There is a correlation between the state of charge (SOC) of the battery and the particle surface concentration $c_{se,p}$ through Equation (21) below.

$$SOC = \frac{\beta - \beta_{0\%}}{\beta_{100\%} - \beta_{0\%}} \qquad <\text{Equation 21}>$$

In Equation (21), $\beta$ is $c_{se,p}/c_{s,max,p}$. That is, $\beta$ is the ratio between the particle surface concentration ($c_{se,p}$) of lithium to the maximum solid-phase concentration ($c_{s,max,p}$) of lithium that can be contained in electrode particles. $\beta_{100\%}$ is the $\beta$ value when the SOC is 100%, and $\beta_{0\%}$ is the $\beta$ value when the SOC is 0%.

During the optimization of the current profile in which the sensitivity of the parameter can be maximized for a given 1800 second time using the GPOPS software, the initial SOC is set to 50%, and as a boundary condition, $V_{max}$ is set to 4.2V, $V_{min}$ is set to 3.105V, $I_{max}$ is set to 72A (during discharge) and $I_{max}$ is set to $-72$A (during charging).

[Optimized Current Profile for the Active Material Volume Fraction $\varepsilon_{s,p}$]

Figure 2:
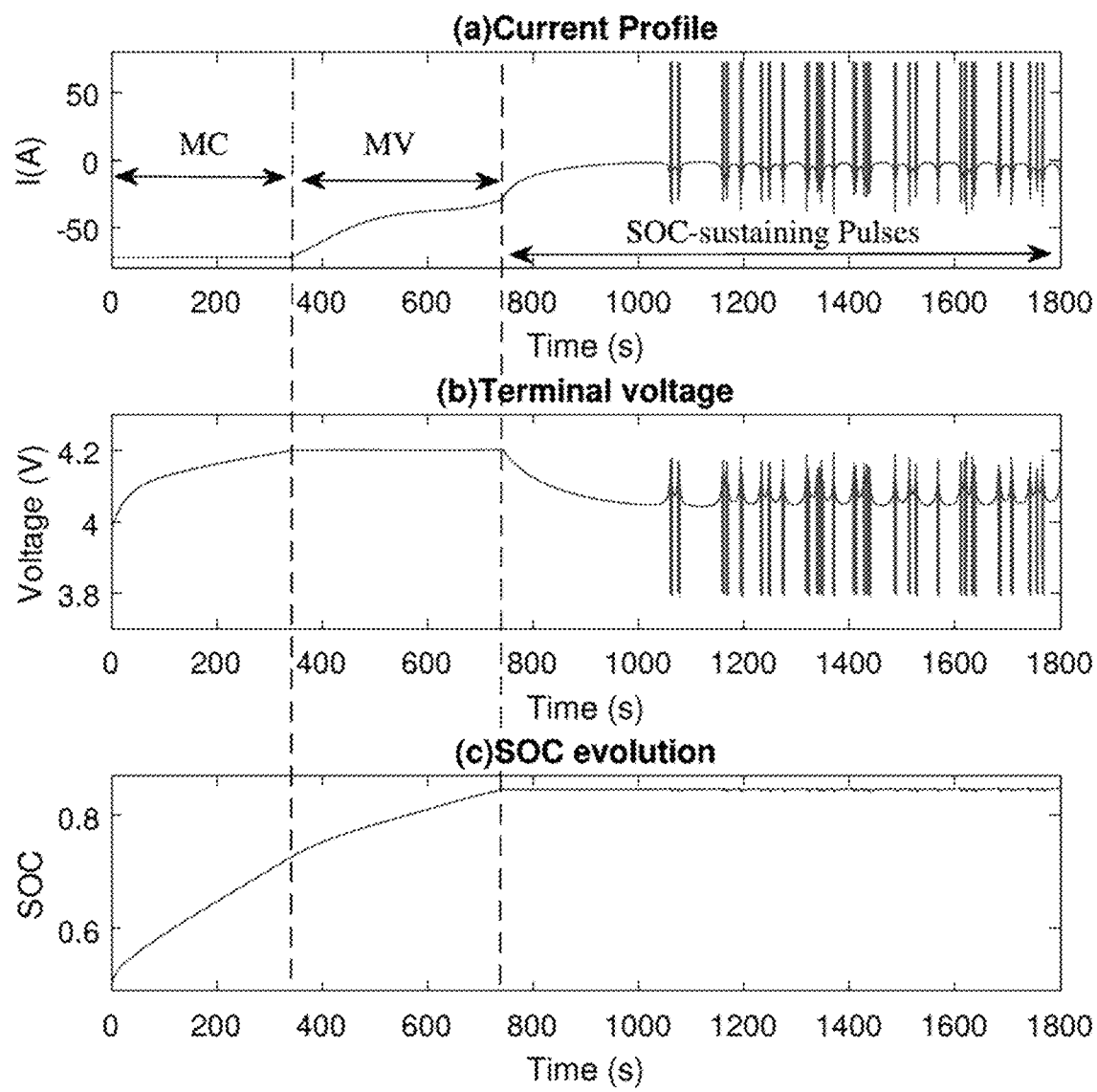
FIG. 2 is a graph showing an optimized current profile for a positive electrode active material volume fraction ($\varepsilon_{s,p}$) and response characteristics for the voltage and SOC corresponding thereto.

The optimized current profile for the cathode active material volume fraction $\varepsilon_{s,p}$ and the resultant voltage and SOC response are demonstrated in FIG. 2.

Figure 3:
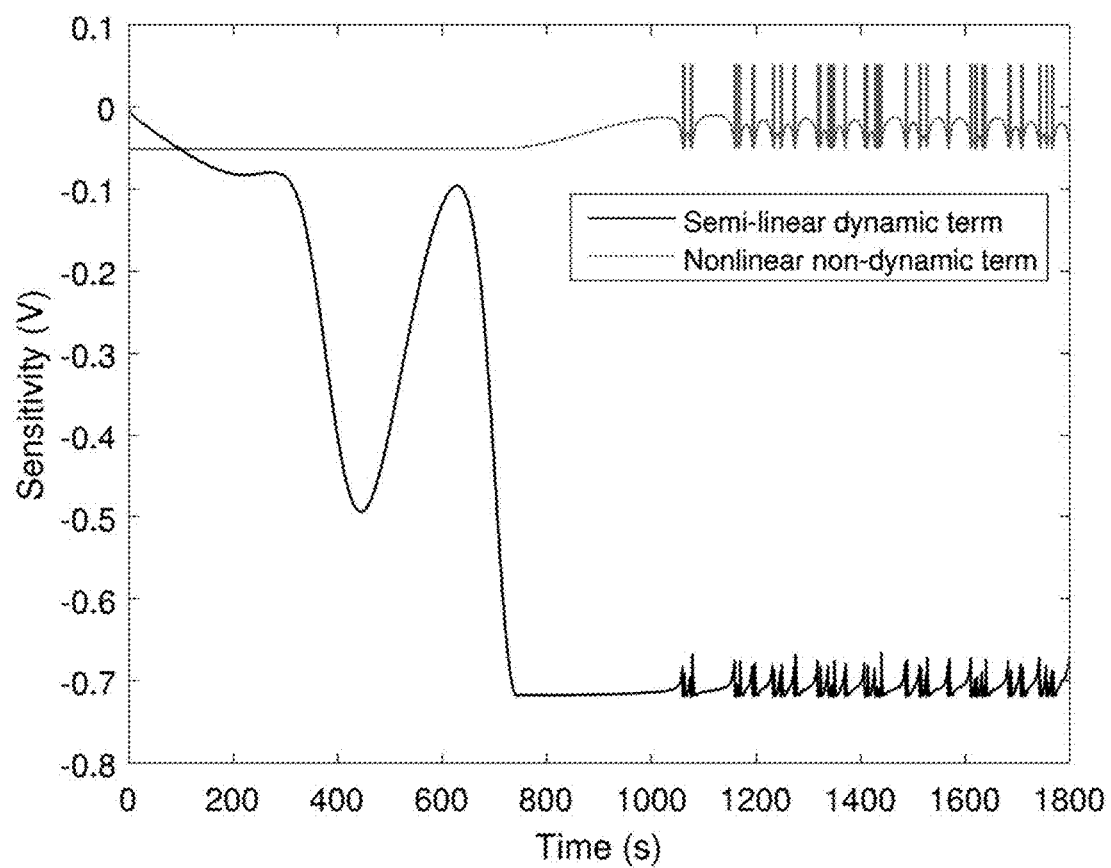
FIG. 3 is a graph independently showing two factors, namely a semi-linear dynamic term and a nonlinear dynamic term, to be compared in order to analyze the characteristics of the optimized current profile.

According to the sensitivity expression in Equation (12), the active material volume fraction $\varepsilon_{s,p}$ of the positive electrode consists of two terms. The first term is $$\frac{\partial \eta_p}{\partial \varepsilon_{s,p}} \frac{\partial \eta_p}{\partial \varepsilon_{s,p}}$$

may be referred to as the nonlinear non-dynamic term as it is mainly a static nonlinear function as in Equation (13). The second term is $$\left(\frac{\partial U_p}{\partial c_{se,p}} + \frac{\partial \eta_p}{\partial c_{se,p}}\right) \cdot \frac{\partial c_{se,p}}{\partial \varepsilon_{s,p}}(t) \left(\frac{\partial U_p}{\partial c_{se,p}} + \frac{\partial \eta_p}{\partial c_{se,p}}\right) \cdot \frac{\partial c_{se,p}}{\partial \varepsilon_{s,p}}(t)$$

may be referred to as the semi-linear dynamic term as it is related to the dynamics of the solid-phase lithium diffusion. It is noted that $$\frac{\partial \eta_p}{\partial c_{se,p}}$$

is generally much smaller than $$\frac{\partial U_p}{\partial c_{se,p}},$$

and is hence neglected in the subsequent analysis. In order to analyze the optimized current profile, the two terms, namely $$\frac{\partial \eta_p}{\partial \varepsilon_{s,p}} \text{ and } \frac{\partial U_p}{\partial c_{se,p}} \frac{\partial c_{se,p}}{\partial \varepsilon_{s,p}},$$

may be illustrated as independent graphs as in FIG. 3.

From FIG. 3, it may be found that the sensitivity of the active material volume fraction $\varepsilon_{s,p}$ is dominated by the semi-linear dynamic term $$\frac{\partial U_p}{\partial c_{se,p}} \frac{\partial c_{se,p}}{\partial \varepsilon_{s,p}}.$$

Therefore, the patterns of the optimal current profile may be largely determined by the dynamics of $$\frac{\partial c_{se,p}}{\partial \varepsilon_{s,p}}$$

and the OCP slope $$\frac{\partial U_p}{\partial c_{se,p}}.$$

Specifically, the dynamics of the state sensitivity $$\frac{\partial c_{se,p}}{\partial \varepsilon_{s,p}}$$

may be captured by the sensitivity transfer function in Equation (14), which features a pole at s=0.

$$\frac{\partial c_{se,p}}{\partial \varepsilon_{s,p}}$$

is essentially an integral of current over time, which will increase/decrease under non-zero current and stay constant under zero current. Consequently, the optimal profile tends to drive the battery SOC towards the point with the largest OCP slope (namely, the point with SOC of 84:5%) and to remain at the corresponding point to attain the maximum $$\frac{\partial U_p}{\partial c_{se,p}} \frac{\partial c_{se,p}}{\partial \varepsilon_{s,p}}.$$

To achieve this, the optimal current profile starts with a maximum current (MC)-maximum voltage (MV) charging phase to approach the desirable SOC as fast as possible as shown in FIG. 2. The current is then gradually cut off to maintain the desirable SOC. The later half of the profile features a series of SOC-sustaining current pulses. The purpose is to further increase the sensitivity through the current-dependent non-linear term $$\frac{\partial \eta_p}{\partial \varepsilon_{s,p}},$$

but its contribution is only marginal though as shown in FIG. 3.

When the optimal current profile is used to estimate the parameter, the Cramer-Rao Bound may be computed to evaluate the expected estimation accuracy. Under the optimized current profile, the normalized Fisher information of $\varepsilon_{s,p}$ may be calculated as in Equation (22) below.

$$\bar{F}_{\varepsilon_{s,p}} = \frac{1}{\sigma_V^2} \int_0^{1800} \bar{S}_{\varepsilon_{s,p}}^2(t) dt = \frac{640}{\sigma_V^2} \qquad <\text{Equation 22}>$$

In addition, Equation (22) gives the normalized Cramer-Rao bound as in Equation (23) below.

$$\sigma(\varepsilon_{s,p}) \geq \bar{F}_{\varepsilon_{s,p}}^{-\frac{1}{2}} = 0.04\sigma_V \qquad <\text{Equation 23}>$$

Equation (23) means that if the standard deviation of the voltage measurement noise $\sigma_v$=0:1 V, the bound on $\sigma(\varepsilon_{s,p})$ will be 0.04×0.1×100%, namely 0.4%, of the nominal value of the active material volume fraction $\varepsilon_{s,p}$.

[Optimized Current Profile for the Solid-Phase Diffusion Coefficient $D_{s,p}$]

Figure 4:
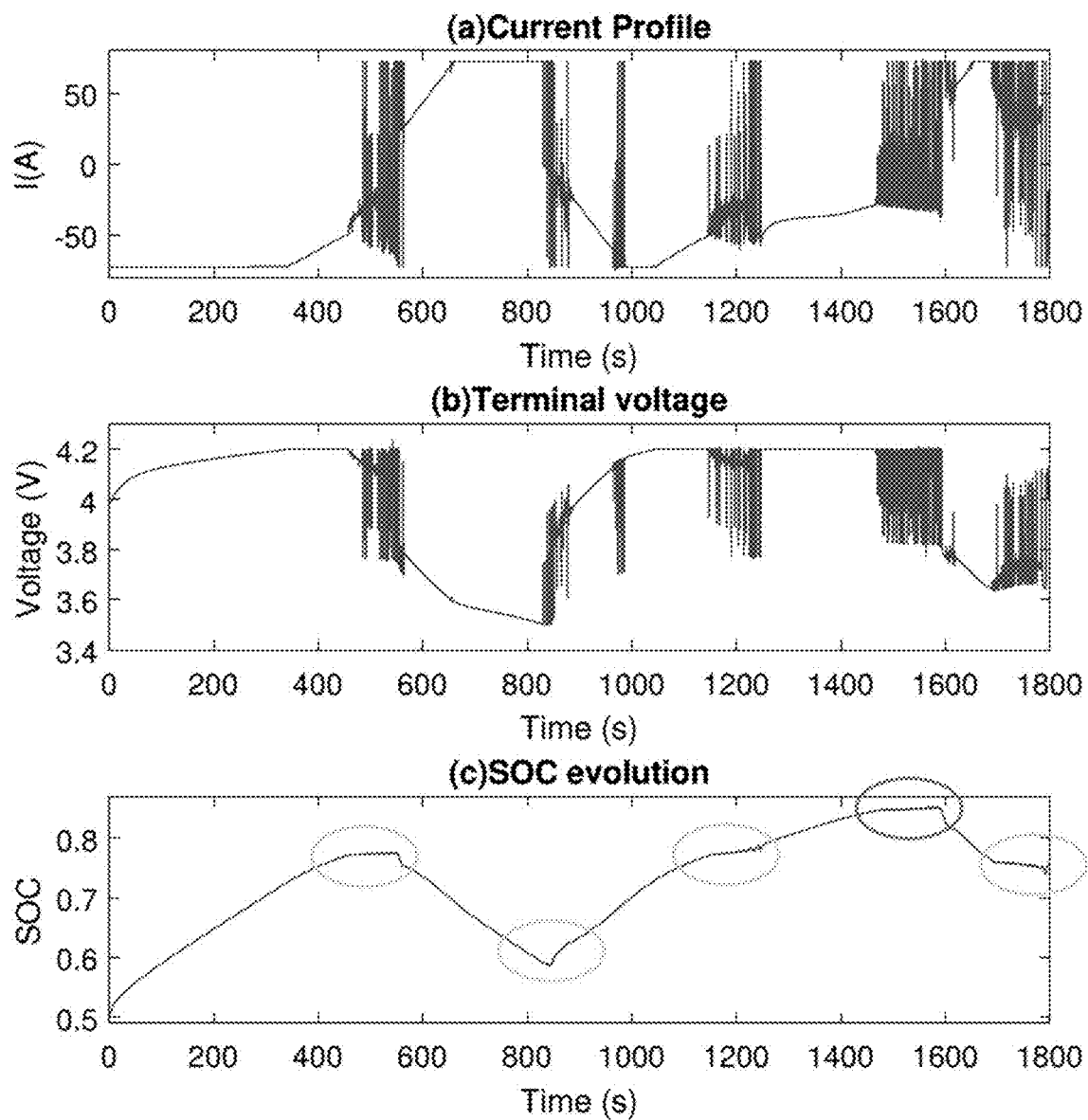
FIG. 4 is a graph showing an optimized current excitation for a solid-phase diffusion coefficient $D_{s,p}$ of the positive electrode and response characteristics for the terminal voltage and SOC corresponding thereto.

FIG. 4 shows the optimized current excitation and corresponding voltage and SOC response for the solid-phase diffusion coefficient $D_{s,p}$ of the positive electrode.

According to the sensitivity expression in Equation (7), the voltage sensitivity of $D_{s,p}$ contains a semi-linear dynamic term $$\left(\frac{\partial U_p}{\partial c_{se,p}} + \frac{\partial \eta_p}{\partial c_{se,p}}\right) \cdot \frac{\partial c_{se,p}}{\partial D_{s,p}},$$

but does not contain the nonlinear non-dynamic term like as the sensitivity of $\varepsilon_s$. It is noted that $$\frac{\partial \eta_p}{\partial c_{se,p}}$$

is minimal compared to $$\frac{\partial U_p}{\partial c_{se,p}},$$

and is neglected in subsequent analysis. The sensitivity of $D_{s,p}$ is hence governed by the joint effect of the state sensitivity $$\frac{\partial c_{se,p}}{\partial D_{s,p}}$$

and the OCP slope $$\frac{\partial U_p}{\partial c_{se,p}},$$

of the positive electrode. The state sensitivity $$\frac{\partial c_{se,p}}{\partial D_{s,p}}$$

is characterized by the sensitivity transfer function in Equation (9) with no pole at s=0, which is different from the sensitivity of the active material volume fraction $\varepsilon_{s,p}$. Therefore, persistent current excitation is needed to render that $$\frac{\partial c_{se,p}}{\partial D_{s,p}}$$

is non-zero. Regarding the OCP slope, as shown in FIG. 1, three peaks are observed at SOC=61.5%, SOC=76.6%, and SOC=84.5% respectively. To attain maximum sensitivity, it is desirable that $$\frac{\partial c_{se,p}}{\partial D_{s,p}} \text{ and } \frac{\partial U_p}{\partial c_{se,p}}$$

have large values at the same time. Due to the coupling effect of $$\frac{\partial c_{se,p}}{\partial D_{s,p}} \text{ and } \frac{\partial U_p}{\partial c_{se,p}},$$

the optimized profile tends to swing the SOC between the peak locations of the OCP slope, as seen in FIG. 4(*c*). During the transition between peaks, the current excitation of the maximum current-maximum voltage will build/retain significant $$\frac{\partial c_{se,p}}{\partial D_{s,p}}$$

to couple with the large OCP slope at the peak locations. When SOC arrives at the peak, the current profile switches to a short pulse period. This maintains the SOC at the OCP slope peak momentarily to maximize the effect of the large OCP slope. Nevertheless, due to the stable nature of the sensitivity transfer function, $$\frac{\partial c_{se,p}}{\partial D_{s,p}}$$

tends to decrease during the SOC-sustaining pulse period, and thus the optimal profile has to switch back to the maximum current-maximum voltage mode shortly to drive the SOC towards the next OCP slope peak location.

Under the optimized current profile, the Fisher information of $D_{s,p}$ may be calculated as in Equation (24) below.

$$\bar{F}_{D_{s,p}} = \frac{1}{\sigma_V^2} \int_0^{1800} \bar{S}_{D_{s,p}}^2(t)dt = \frac{1.357}{\sigma_V^2} \qquad <\text{Equation 24}>$$

Equation (24) gives the normalized Cramer-Rao bound that can be expressed as Equation (25).

$$\sigma(D_{s,p}) \geq \bar{F}_{D_{s,p}}^{-\frac{1}{2}} = 0.858\sigma_V \qquad <\text{Equation 25}>$$

Equation (25) means that if the standard deviation of the voltage noise $\sigma_v$=0:1 V, the Cramer-Rao bound on $\sigma(D_{s,p})$ will be 0.858×0.1×100%=8.56%, namely 8.58%, of the nominal value of $D_{s,p}$. Optimizing current profile over a longer time domain can reduce the error bound if desirable.

[Optimized Current Profile for the Reaction Rate Constant $k_p$]

Figure 5:
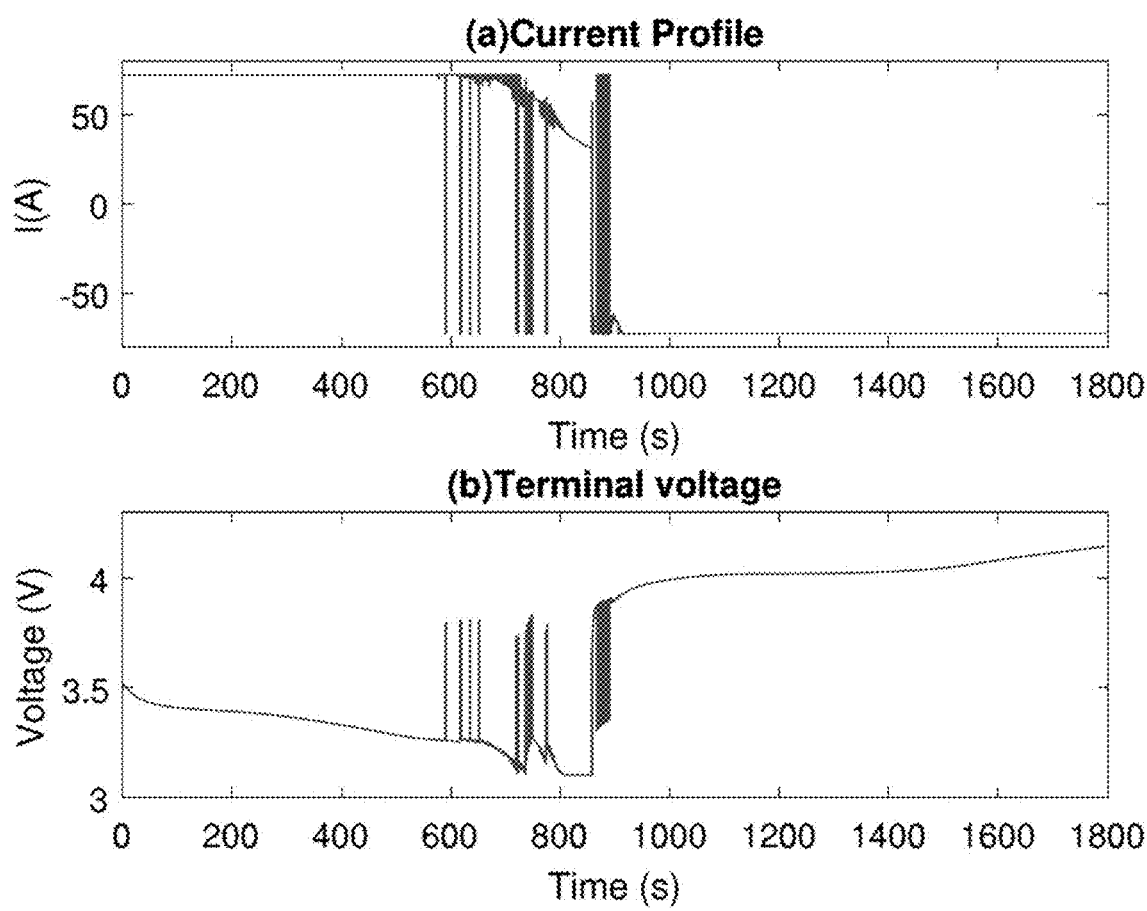
FIG. 5 is a graph showing an optimized current profile for a reaction rate constant $k_p$ and a response characteristic for the voltage corresponding to the reaction rate constant $k_p$.

The optimized current profile and the corresponding voltage response for the reaction rate constant $k_p$ are provided in FIG. 5.

The current pattern is basically maximum current (MC)-maximum voltage (MV) charging followed by maximum current discharging, with occasional alternation between maximum current (MC) charging and maximum current (MC) discharging during the process. The feature can be easily understood by correlating to the analytic sensitivity expression of $k_p$ in Equation (16). According to Equation (16), the sensitivity of $k_p$ is a monotonically increasing function of the magnitude of current I, and hence either maximum current charging or maximum current discharging is desirable to maximize the sensitivity. The slight dependence of $$\frac{\partial V}{\partial k_p}$$

on $c_{se}$/SOC through the exchange current density $j_{0,i}$ only has negligible impact on the sensitivity.

Under the optimized current profile, the Fisher information is obtained as Equation (26) below.

$$\bar{F}_{k_p} = \frac{1}{\sigma_V^2} \int_0^{1800} \bar{S}_{k_p}^2(t)dt = \frac{4.724}{\sigma_V^2} \qquad <\text{Equation 26}>$$

Equation (26) gives the normalized Cramer-Rao bound that can be expressed by Equation (27) below.

$$\sigma(k_p) \geq \overline{F}_{k_p}^{-\frac{1}{2}} = 0.46\sigma_V \qquad \text{<Equation 27>}$$

Equation (27) means that if the standard deviation of the voltage measurement noise $\sigma_v=0:1$ V, the Cramer-Rao bound on $\sigma(k_p)$ will be $0.46\times0.1\times100\%=4.6\%$, namely 4.6%, of the nominal value of $k_p$.

In the present disclosure, the optimization of current excitation for battery electrochemical parameter estimation is provided. A methodology to design the optimal current profile over a given time domain has been formulated based on the analytic sensitivity expressions derived.

In an embodiment of the present disclosure, the results for three parameters, namely the solid phase diffusion coefficient $D_s$, the volume fraction of the electrode active material $\varepsilon_s$, and the reaction rate constant k are demonstrated. The optimal patterns for different parameters and the underlying mechanisms have been discovered by correlating to the analytic expressions of the parameter sensitivity. It is interesting to note that the optimal patterns for different parameters are fundamentally distinctive. The numerical results may depend on the specific battery chemistry and parameter set under consideration. However, I the fundamental patterns and features considered in the present disclosure are believed to be generalizable. In future work, the obtained optimized current profile will be used to estimate respective parameters, with the goal of significantly improving the estimation accuracy.

Preferably, the excitation of an optimal current profile for identification of battery electrochemical parameters and the identification of parameters using the excitation may be implemented through a computer system.

Figure 6:
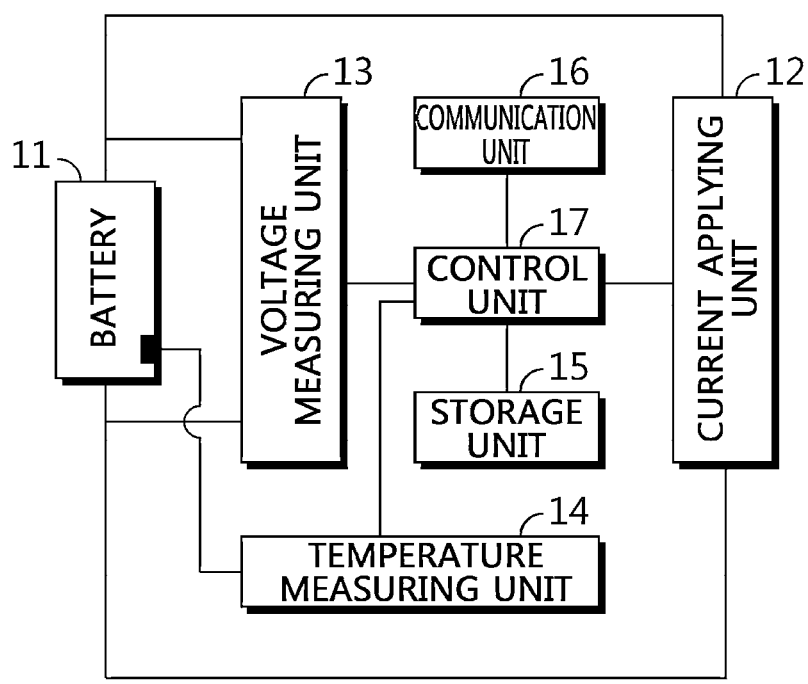
FIG. 6 is a schematic diagram of a system capable of optimizing current excitation for identification of battery electrochemical parameters and identifying the electrochemical parameters according to an embodiment of the present disclosure.

FIG. 6 is a block diagram schematically showing a system 10 for generating an optimal current profile for identification of an electrochemical parameter and estimating an electrochemical parameter using the optimal current profile according to an embodiment of the present disclosure.

Referring to FIG. 6, the system 10 may include a current applying unit 12 for applying a charging current and/or a discharging current to a battery 11, a voltage measuring unit 13 and a temperature measuring unit 14 for measuring voltage and temperature of the battery 11 while a current is flowing through the battery 11, respectively, a storage unit 15 for storing programs and data necessary for implementation of the present disclosure, a communication unit 16 for transmitting and receiving data with an external device, and a control unit 17 for controlling the overall operation of the system.

The voltage measuring unit 13 includes a voltage measuring circuit capable of measuring the voltage of the battery 11, and the temperature measuring unit 14 includes a thermocouple capable of measuring the temperature of the battery 11.

There is no particular limitation on the type of the storage unit 15 as long as it is a storage medium capable of recording and erasing information. As an example, the storage unit 15 may be a hard disk, a RAM, a ROM, an EEPROM, a register, or a flash memory. The storage unit 15 stores and/or updates and/or erases and/or transmits a program including various control logics performed by the control unit 17, and/or data generated when the control logic is executed, look-up tables, functions and parameters defined in advance, chemical/physical/electrical constants, or the like.

The communication unit 16 includes a known communication interface that supports communication between two different communication media. In an example, the communication interface may support CAN communication, daisy chain communication, RS 232 communication, or the like.

The control unit 17 may optionally include a processor, an application-specific integrated circuit (ASIC), another chipset, a logic circuit, a register, a communication modem, a data processing device, or the like, known in the art to execute the various control logics.

The control unit 17 may determine an optimal current profile in which the sensitivity is maximized with respect to an electrochemical parameter included in the electrochemical model of the battery 11. Equation (1-1) described above is an example of the electrochemical model.

Preferably, the control unit 17 may combine the above-described equations as necessary to determine the optimal current profile having a maximum sensitivity for the electrochemical parameter in a preset time domain (e.g., 1800 seconds) and record the optimal current profile in the storage unit 15.

Preferably, the optimal current profile may vary depending on the type of electrochemical parameter. That is, the optimal current profile depends on the electrochemical parameters.

The control unit 17 may determine a transfer function from a battery current (I) to a particle surface concentration $(c_{se,i})$ of the electrode by using an electrochemical model of the battery to which single particle assumption is applied, in order to determine the optimal current profile, and determine a sensitivity transfer function corresponding to a partial derivative $$\frac{\partial C_{se,i}}{\partial \theta}$$

of the electrochemical parameter ($\theta$) for the corresponding transfer function.

Preferably, the transfer function from the battery current to the particle surface concentration of the electrode may be determined as in Equation (2) by solving the governing equations of the electrochemical model using the single particle assumption, Laplace transform, and Pade approximation.

In one example, when the electrochemical parameter is a solid-phase diffusion coefficient $D_{s,i}$ of the electrode, the sensitivity transfer function may be expressed as Equation (9). In another example, when the electrochemical parameter is an active material volume fraction $\varepsilon_{s,i}$ of the electrode, the sensitivity transfer function may be expressed as Equation (14).

The control unit 17 may also determine an overpotential slope corresponding to a partial derivative of the particle surface concentration $(c_{se,i})$ for an overpotential $(\eta_i)$ of the electrode or a partial derivative of the electrochemical parameter ($\theta$, e.g., an active material volume fraction $\varepsilon_{s,i}$) for the overpotential $(\eta_i)$ of the electrode by using a Butler-Volmer equation of Equation (3) defining a correlation between the electrode particle surface concentration $(c_{se,i})$ and the electrode overpotential $(\eta_i)$, as in Equation 8 or Equation 13.

The control unit 17 may also determine an OCP slope corresponding to the partial derivative of the particle surface concentration for an OCP function of the electrode. Preferably, the control unit 17 may determine the OCP slope by using a predefined OCP function $U_i(c_{se,i})$.

The control unit 17 may determine a sensitivity profile of the electrochemical parameter for a battery voltage of the electrochemical model in a preset time domain by using the sensitivity transfer function and/or the overpotential slope and/or the OCP slope.

The control unit 17 may also change a battery current in the preset time domain and determine a current profile so that the square integral in the time domain for the sensitivity profile changing accordingly is maximized. Here, the current profile is an optimal current profile with maximum sensitivity to the electrochemical parameter.

In an example, the control unit 17 may determine an optimal current profile with the maximum sensitivity for the solid-phase diffusion coefficient $D_{s,i}$ of the electrode by using Equation (7) and Equation (17). In addition, the control unit 17 may determine an optimal current profile with the maximum sensitivity for the active material volume fraction $\varepsilon_{s,i}$ of the electrode by using Equation (12) and Equation (17). In addition, the control unit 17 may determine an optimal current profile with the maximum sensitivity for the reaction rate constant $k_i$ of the electrode by using Equation (16) and Equation (17).

Preferably, the control unit 17 may determine the optimal current profile so as not to deviate from a preset current boundary condition. Also, the control unit 17 may determine the optimal current profile so that the battery voltage determined from the electrochemical model does not deviate from a preset voltage boundary condition.

Specifically, the control unit 17 may use a pseudo-spectral method, preferably a Legendre-Gauss-Radau (LGR) pseudo-spectral method with adaptive multi-mesh-interval collocation, when determining the optimal current profile under the boundary conditions of voltage and current using Equation (17). That is, the control unit 17 adaptively determines the optimal current profile using the pseudo-spectral method so that the square integral of the normalized sensitivity equation $S_\theta(t)$ of Equation (18) is maximized in the target time domain $(t_0 \sim t_f)$. The sensitivity equation $S_\theta(t)$ corresponds to the sensitivity profile representing the change in sensitivity in the preset time domain. Since the sensitivity equation $S_\theta(t)$ includes the battery current as a variable, the sensitivity profile depends on the current profile. In one example, the control unit 17 may use General Purpose Optimal Control Software (GPOPS) to implement the LGR pseudo-spectral method. The GPOPS may receive the normalized sensitivity equation $S_\theta(t)$ related to the time domain, the voltage boundary condition, the current boundary condition and the sensitivity, and generate a variable profile (optimal current profile) of the sensitivity equation in the time domain so that the square integral of the normalized sensitivity equation is maximized.

After determining the optimal current profile for the electrochemical parameter, the control unit 17 may apply the optimal current profile to the battery 11 for a time corresponding to a preset time domain (e.g., 1800 seconds) by using the current applying unit 12.

Applying the optimal current profile to the battery means adjusting the magnitude of the current according to the optimal current profile while charging and/or discharging the battery 11 for a time corresponding to the time domain.

The control unit 17 may measure the battery voltage using the voltage measuring unit 13 while the optimal current profile is applied to the battery 11 in the preset time domain, generate a measured battery voltage profile, and record the measured battery voltage profile in the storage unit 15. Here, the measured battery voltage profile is a profile representing the change of the battery voltage according to time.

The control unit 17 may also measure battery temperature using the temperature measuring unit 14 while the optimal current profile is applied to the battery 11 in the preset time domain, generate a battery measurement temperature profile and record the battery measurement temperature profile in the storage unit 15. Here, the battery measurement temperature profile is a profile representing the change of the battery temperature according to time.

The control unit 17 may also generate a predicted battery voltage profile by predicting battery voltage from the battery current profile and the measured battery temperature profile for a time corresponding to the time domain using the electrochemical model of the battery 11, and may record the predicted battery voltage profile in the storage unit 15.

In the present disclosure, the electrochemical model of the battery 11 may be predefined by Equation (1-1) described above. The parameters and functions $U_i(c_{se,i})$, $\Phi_{e,i}$ and $\eta_i$ of the electrochemical model may vary depending on the chemistry of the battery 11. In addition, the functions may be simplified (reduced) by reformulation techniques such as single particle assumption, Laplace transform, and Padé approximation. In addition, the parameters and functions of the electrochemical model may be recorded in advance in the storage unit 15 or included as variables or functions of a program executed by the control unit 17.

Various electrochemical models are known in the art. It is obvious that any known electrochemical model can be employed for the implementation of the present disclosure. In one example, the electrochemical model disclosed in the paper "Design and parametrization analysis of a reduced-order electrochemical model of graphite/LiFePO$_4$ cells for SOC/SOH estimation, Journal of Power Sources. Vol. 237, pp. 310-324, 2013 may be referred to, but the present disclosure is not limited thereto.

If the difference between the predicted battery voltage profile and the measured battery voltage profile is greater than the threshold, the control unit 17 may also adaptively adjust the electrochemical parameter so that the difference between the predicted battery voltage profile and the measured battery voltage profile is reduced to a preset reference value, identify the adjusted electrochemical parameter as a current electrochemical parameter of the battery, and record the same in the storage unit 15.

The difference between the predicted battery voltage profile and the measured battery voltage profile may be determined by calculating an integral value for each profile in the time domain and determining the ratio of the difference between the two integral values to the integral value of any one profile, but the present disclosure is not limited thereto.

The control unit 17 may also calculate the change amount of the electrochemical parameter identified at the current time in comparison with the electrochemical parameter of the battery 11 in a BOL (Beginning Of Life) state, quantitatively determine SOH (State Of Health) of the battery 11 according to the change amount and record the same in the storage unit 15.

In one example, when the solid-phase diffusion coefficient $D_{s,p}$ for the positive electrode of the battery 11 decreases by 10% compared to the BOL state, the SOH of the positive electrode of the battery 11 may be determined to be 90%. In another example, when the active material volume fraction $\varepsilon_{s,p}$ for the positive electrode decreases by 10% compared to the BOL state, the SOH of the positive electrode of the battery 11 may be determined to be 90%. In another example, when the reaction rate constant $k_i$ for the positive electrode decreases by 10% compared to the BOL state, the SOH of the positive electrode of the battery 11 may be determined to be 90%.

The SOH determined according to the present disclosure may be used to change the charge/discharge control logic of the battery 11. In one example, as the SOH increases, the charge cut-off voltage may be lowered or the discharge cut-off voltage may be increased. In another example, as the SOH increases, the magnitude of the maximum charge/discharge current may be attenuated. In still another example, it is possible to reduce the width of the SOC section in which the charge/discharge is performed. In addition, it is obvious to those skilled in the art that factors affecting the safety of the battery 11 may be adjusted according to the increase in SOH.

The control unit 17 may transmit the optimal current profile or the identified electrochemical parameter to an external device through the communication unit 16. In addition, the control unit 17 may receive programs, parameters, functions, chemical/physical/electrical constants, or the like necessary for implementation of the present disclosure from the external device and record the same in the storage unit 15.

The above-described system 10 may be included in a control system of a device including the battery 11. The device may be an electric vehicle, a hybrid electric vehicle, a plug-in hybrid vehicle, an energy storage system, and the like, but the present disclosure is not limited thereto. The control system may be, for example, a BMS (Battery Management System).

In another example, the above-described system 10 may be included in a device for diagnosing performance of the battery 11. In this case, information about parameters, functions, chemical/physical/electrical constants, or the like included in the electrochemical model for each model of the battery 11 may be recorded in the storage unit 15. In addition, the control unit 17 may receive model information regarding the battery 11 prior to generation of the optimal current profile. The model information of the battery 11 may be directly input through an interface of the program or may be transmitted from the control system of the device including the battery 11 through the communication unit 16. Then, the control unit 17 may determine the optimal current profile corresponding to the aimed electrochemical parameter by referring to the parameters, functions, and chemical/physical/electrical constants included in the electrochemical model matching the model of the battery 11.

It is obvious to those skilled in the art that the combination of control logics performed by the control unit 17 described above may be steps included in a method for optimization of current excitation for identification of battery electrochemical parameters, and or a method for identification of electrochemical parameters using the same.

In addition, one or more of the various control logics of the control unit 17 may be combined, and the combined control logics may be written in a computer-readable code system and recorded in a computer-readable recording medium. The recording medium is not particularly limited as long as it is accessible by a processor included in a computer. As an example, the storage medium includes at least one selected from the group consisting of a ROM, a RAM, a register, a CD-ROM, a magnetic tape, a hard disk, a floppy disk and an optical data recording device.

The code scheme may be distributed to a networked computer to be stored and executed therein. In addition, functional programs, codes and code segments for implementing the combined control logics may be easily inferred by programmers in the art to which the present disclosure belongs.

In the description of the various exemplary embodiments of the present disclosure, it should be understood that the element referred to as 'unit' is distinguished functionally rather than physically. Therefore, each element may be selectively integrated with other elements or each element may be divided into sub-elements for effective implementation control logic(s). However, it is obvious to those skilled in the art that, if functional identity can be acknowledged for the integrated or divided elements, the integrated or divided elements fall within the scope of the present disclosure.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

What is claimed is:

1. A system for optimization of current excitation for identification of battery electrochemical parameters, the system comprising:
   a current applying circuit coupled to a battery;
   a voltage measuring circuit configured to measure a voltage of the battery; and
   a controller operably coupled to the current applying circuit and the voltage measuring circuit,
   wherein the controller is configured to:
   determine a sensitivity transfer function corresponding to a partial derivative of an electrochemical parameter for a transfer function from a battery current to a particle surface concentration of an electrode by using an electrochemical model of the battery;
   determine an overpotential slope corresponding to a partial derivative of the particle surface concentration for an overpotential of the electrode or a partial derivative of an electrochemical parameter for the overpotential of the electrode by using the particle surface concentration of the electrode and a Butler-Volmer equation defining a correlation between the electrochemical parameter and the overpotential of the electrode;
   determine an OCP (Open Circuit Potential) slope corresponding to the partial derivative of the particle surface concentration for an OCP function of the electrode;
   determine a sensitivity profile of the electrochemical parameter for a battery voltage of the electrochemical model in a time domain by using the sensitivity transfer function, the overpotential slope and the OCP slope; and
   change a battery current in the time domain and determine an optimal current profile so that a square integral of the sensitivity profile changing according to the battery current in the time domain is maximized.

2. The system according to claim 1,
   wherein the controller is further configured to change the battery current in the time domain not to deviate from a preset current boundary condition.

3. The system according to claim 1,
   wherein the controller is further configured to change the battery current in the time domain so that the battery voltage of the electrochemical model does not deviate from a preset voltage boundary condition.

4. The system according to claim 1, wherein the controller is further configured to determine the optimal current profile using a pseudo-spectral method so that the square integral of the sensitivity profile changing according to the battery current in the time domain is maximized.

5. The system according to claim 4, wherein the pseudo-spectral method is a Legendre-Gauss-Radau (LGR) pseudo-spectral method with adaptive multi-mesh-interval collocation.

6. The system according to claim 1, wherein the electrochemical model of the battery adopts single particle assumption and expresses the battery voltage (V) by the following equation:

$$V = \phi_{s,p} - \phi_{s,n} = (U_p(c_{se,p}) - U_n(c_{se,n})) + (\phi_{e,p} - \phi_{e,n}) + (\eta_p - \eta_n) - IR_l,$$

where $\Phi_{s,I}$ is an electrode potential, $\Phi_{e,I}$ is an electrolyte potential at an electrode boundary, U is a predefined OCP function (V), $c_{se,I}$ is a particle surface concentration of lithium ion (mol·m$^{-3}$), $\eta_i$ is an overpotential at an electrode-electrolyte interface, $R_l$ is a lumped ohmic resistance of battery ($\Omega$·m$^2$), i=p denotes a positive electrode, and i=n denotes a negative electrode.

7. The system according to claim 1, wherein the transfer function from the battery current to the particle surface concentration of the electrode is expressed by the following equation:

$$c_{se,i}(s) = \left[\frac{-7R_{s,i}^4 s^2 + 420 D_{s,i} R_{s,i}^2 s + 3465 D_{s,i}^2}{F\varepsilon_{s,i} A \delta_i s \left(R_{s,i}^4 s^2 + 189 D_{s,i} R_{s,i}^2 s + 3465 D_{s,i}^2\right)}\right] \cdot I(s),$$

where $c_{se,I}$ is a particle surface concentration of lithium inserted into the electrode (mol·m$^{-3}$), I is the battery current (A), $R_{s,I}$ is a radius of an electrode particle (m), $D_{s,I}$ is a solid-phase diffusion coefficient of the electrode particle (m$^2$s$^{-1}$), A is an electrode area (m$^2$), $\delta_i$ is a thickness of the electrode (m), $\varepsilon_{s,I}$ is a volume fraction of an active material with activity at the electrode (no unit), F is a Faraday constant (C·mol$^{-1}$), I is an index indicating the type of electrode, which is p and n for a positive electrode and a negative electrode, respectively, and s is a Laplace transform variable.

8. The system according to claim 1, wherein the electrochemical parameter is a solid-phase diffusion coefficient $D_{s,i}$ of the electrode, and wherein the controller is further configured to determine a sensitivity profile $$\frac{\partial V(t)}{\partial D_{s,i}}$$

for the solid-phase diffusion coefficient $D_{s,i}$ of the electrode to the battery voltage V in the time domain by using the following equation:

$$\frac{\partial V(t)}{\partial D_{s,i}} = \pm\left(\frac{\partial \eta_i}{\partial c_{se,i}} + \frac{\partial U_i}{\partial c_{se,i}}\right) \cdot \frac{\partial c_{se,i}}{\partial D_{s,i}}(t),$$

where $$\frac{\partial \eta_i}{\partial c_{se,i}}$$

is an overpotential slope corresponding to the partial derivative of the particle surface concentration $c_{se,i}$ for the overpotential $\eta_i$ of the electrode, $$\frac{\partial U_i}{\partial c_{se,i}}$$

is an OCP slope corresponding to the partial derivative of the particle surface concentration $c_{se,i}$ for the OCP function $U_i$ of the electrode, and $$\frac{\partial c_{se,i}}{\partial D_{s,i}}$$

is a sensitivity transfer function corresponding to the partial derivative of the solid-phase diffusion coefficient $D_{s,i}$ of the electrode for the transfer function from the battery current to the particle surface concentration $c_{se,i}$ of the electrode.

9. The system according to claim 1, wherein the electrochemical parameter is an active material volume fraction $\varepsilon_{s,i}$ of the electrode, and wherein the controller is further configured to determine a sensitivity profile $$\frac{\partial V(t)}{\partial \varepsilon_{s,i}}$$

for the active material volume fraction $\varepsilon_{s,i}$ of the electrode to the battery voltage V in the time domain by using the following equation:

$$\frac{\partial V(t)}{\partial \varepsilon_{s,i}} = \mp \frac{\partial \eta_i}{\partial \varepsilon_{s,i}}(t) \pm \left(\frac{\partial U_i}{\partial c_{se,i}} + \frac{\partial \eta_i}{\partial c_{se,i}}\right) \cdot \frac{\partial c_{se,i}}{\partial \varepsilon_{s,i}}(t),$$

where $$\frac{\partial \eta_i}{\partial c_{se,i}}$$

is an overpotential slope corresponding to the partial derivative of the particle surface concentration $c_{se,i}$ for the overpotential $\eta_i$ of the electrode, $$\frac{\partial \eta_i}{\partial \varepsilon_{s,i}}(t)$$

is an overpotential slope corresponding to the partial derivative of the active material volume fraction $\varepsilon_{s,i}$ for the overpotential $\eta_i$ of the electrode, $$\frac{\partial U_i}{\partial c_{se,i}}$$

is an OCP slope corresponding to the partial derivative of the particle surface concentration $c_{se,i}$ for the OCP function $U_i$ of the electrode, and $$\frac{\partial c_{se,i}}{\partial \varepsilon_{s,i}}(t)$$

is a sensitivity transfer function corresponding to the partial derivative of the active material volume fraction $\varepsilon_{s,i}$ of the electrode for the transfer function from the battery current to the particle surface concentration $c_{se,i}$ of the electrode.

10. A system for identification of battery electrochemical parameters using the system according to claim 1, wherein the controller is further configured to:
generate a measured battery voltage profile by measuring a battery voltage while applying the optimal current profile to the battery during a time corresponding to the time domain;
generate a predicted battery voltage profile by predicting a battery voltage from the battery current profile during the time corresponding to the time domain by using the electrochemical model;
decrease a difference between the predicted battery voltage profile and the measured battery voltage profile to a preset reference value by adjusting the electrochemical parameter, when the difference between the predicted battery voltage profile and the measured battery voltage profile is greater than a threshold; and
identify the adjusted electrochemical parameter as a current electrochemical parameter of the battery.

11. A system for optimization of current excitation for identification of battery electrochemical parameters, the system comprising:
a current applying device coupled to a battery;
a voltage measuring device configured to measure a voltage of the battery; and
a controller operably coupled to the current applying device and the voltage measuring device,
wherein the controller is configured to:
determine an overpotential slope corresponding to a partial derivative of a reaction rate constant of an electrode for an overpotential of the electrode by using a particle surface concentration of the electrode and a Butler-Volmer equation defining a correlation between the reaction rate constant of the electrode and the overpotential of the electrode;
determine a sensitivity profile of the reaction rate constant for a battery voltage of an electrochemical model in a time domain by using the overpotential slope; and
change a battery current in the time domain and determine an optimal current profile so that a square integral of the sensitivity profile changing according to the battery current in the time domain is maximized.

12. The system according to claim 11, wherein the controller is further configured to change the battery current in the time domain not to deviate from a preset current boundary condition.

13. The system according to claim 11, wherein the controller is further configured to change the battery current in the time domain so that the battery voltage of the electrochemical model does not deviate from a preset voltage boundary condition.

14. The system according to claim 11, wherein the controller is further configured to determine the optimal current profile using a pseudo-spectral method so that the square integral of the sensitivity profile changing according to the battery current in the time domain is maximized.

15. The system according to claim 14, wherein the pseudo-spectral method is a Legendre-Gauss-Radau (LGR) pseudo-spectral method with adaptive multi-mesh-interval collocation.

16. The system according to claim 11, wherein the controller is further configured to determine a sensitivity profile for the reaction rate constant $k_i$ of the electrode to the battery voltage V in the time domain by using the following equation:

$$\frac{\partial V(t)}{\partial k_i} = \pm \frac{\partial \eta_i}{\partial k_i} = \frac{\mp RT}{\alpha F k_i} \cdot \frac{\text{sign}(I)}{\sqrt{1+\left(\frac{6\varepsilon_{s,i} j_{0,i} A \delta_i}{IR_{e,i}}\right)^2}},$$

where I is the battery current, R is an universal gas constant (J·mol$^{-1}$·K$^{-1}$), T is a battery temperature (K), F is a Faraday constant (C·mol$^{-1}$), $\varepsilon_{s,I}$ is a volume fraction of an active material with activity at the electrode (no unit), $j_{0,I}$ is an exchange current density (A·m$^{-2}$), α is a charge transfer coefficient, A is an effective electrode area (m$^2$), $R_{s,I}$ is a radius of an electrode particle (m), and $\delta_i$ is a thickness of the electrode (m).

17. A system for identification of battery electrochemical parameters using the system according to claim 11, wherein the controller is further configured to:
generate a measured battery voltage profile by measuring a battery voltage while applying the battery current profile to the battery during a time corresponding to the time domain;
generate a predicted battery voltage profile by predicting a battery voltage from the battery current profile during the time corresponding to the time domain by using the electrochemical model of the battery;
decrease a difference between the predicted battery voltage profile and the measured battery voltage profile to a preset reference value by adjusting the reaction rate constant of the electrode, when the difference between the predicted battery voltage profile and the measured battery voltage profile is greater than a threshold; and
identify the adjusted reaction rate constant of the electrode as a current reaction rate constant.

18. A method for optimization of current excitation for identification of battery electrochemical parameters, the method comprising:
(a) determining a sensitivity transfer function corresponding to a partial derivative of an electrochemical parameter for a transfer function from a battery current to a particle surface concentration of an electrode by using an electrochemical model of a battery to which single particle assumption is applied;
(b) determining an overpotential slope corresponding to a partial derivative of the particle surface concentration for an overpotential of the electrode or a partial derivative of an electrochemical parameter for the overpotential of the electrode by using the particle surface concentration of the electrode and a Butler-Volmer equation defining a correlation between the electrochemical parameter and the overpotential of the electrode;

(c) determining an OCP (Open Circuit Potential) slope corresponding to the partial derivative of the particle surface concentration for an OCP function of the electrode;

(d) determining a sensitivity profile of the electrochemical parameter for a battery voltage of the electrochemical model in a time domain by using the sensitivity transfer function, the overpotential slope and the OCP slope; and (e) changing a battery current in the time domain and determining an optimal current profile so that a square integral of the sensitivity profile changing according to the battery current in the time domain is maximized.

19. A method for identification of battery electrochemical parameters using the method according to claim 18, comprising:

generating a measured battery voltage profile by measuring a battery voltage while applying the optimal current profile to the battery during a time corresponding to the time domain;

generating a predicted battery voltage profile by predicting a battery voltage from the battery current profile during the time corresponding to the time domain by using the electrochemical model;

decreasing a difference between the predicted battery voltage profile and the measured battery voltage profile to a preset reference value by adjusting the electrochemical parameter, when the difference between the predicted battery voltage profile and the measured battery voltage profile is greater than a threshold; and identifying the adjusted electrochemical parameter as a current electrochemical parameter.

20. A method for optimization of current excitation for identification of battery electrochemical parameters, the method comprising:

(a) determine an overpotential slope corresponding to a partial derivative of a reaction rate constant of an electrode for an overpotential of the electrode by using a particle surface concentration of the electrode and a Butler-Volmer equation defining a correlation between the reaction rate constant of the electrode and the overpotential of the electrode;

(b) determine a sensitivity profile of the reaction rate constant for a battery voltage of an electrochemical model in a time domain by using the overpotential slope; and (c) changing a battery current in the time domain and determining an optimal current profile so that a square integral of the sensitivity profile changing according to the battery current in the time domain is maximized.

21. A method for identification of battery electrochemical parameters using the method according to claim 20, comprising:

generating a measured battery voltage profile by measuring a battery voltage while applying the battery current profile to the battery during a time corresponding to the time domain;

generating a predicted battery voltage profile by predicting a battery voltage from the battery current profile during the time corresponding to the time domain by using the electrochemical model;

decreasing a difference between the predicted battery voltage profile and the measured battery voltage profile to a preset reference value by adjusting the reaction rate constant of the electrode, when the difference between the predicted battery voltage profile and the measured battery voltage profile is greater than a threshold; and identifying the adjusted reaction rate constant of the electrode as a current reaction rate constant.

* * * * *